(12) United States Patent
Newman et al.

(10) Patent No.: US 10,598,734 B2
(45) Date of Patent: Mar. 24, 2020

(54) REPORTING OF VEHICLE BATTERY STATE OF HEALTH AND CHARGE

(71) Applicant: NIO USA, Inc., San Jose, CA (US)

(72) Inventors: Austin L. Newman, San Jose, CA (US); Alexander J. Smith, White Lake, MI (US); Adam H. Ing, Santa Clara, CA (US)

(73) Assignee: NIO USA, Inc., San Jose, CA (US)

(*) Notice: Subject to any disclaimer, the term of this patent is extended or adjusted under 35 U.S.C. 154(b) by 293 days.

(21) Appl. No.: 15/396,057

(22) Filed: Dec. 30, 2016

(65) Prior Publication Data

US 2018/0188332 A1 Jul. 5, 2018

(51) Int. Cl.

| | |
|---|---|
| *G01R 31/371* | (2019.01) |
| *G01R 31/392* | (2019.01) |
| *G01R 31/396* | (2019.01) |
| *B60K 35/00* | (2006.01) |
| *B60L 58/12* | (2019.01) |
| *B60L 53/66* | (2019.01) |

(52) U.S. Cl.
CPC ............ *G01R 31/371* (2019.01); *B60K 35/00* (2013.01); *B60L 53/665* (2019.02); *B60L 58/12* (2019.02); *G01R 31/392* (2019.01); *G01R 31/396* (2019.01); *B60K 2370/169* (2019.05); *B60K 2370/171* (2019.05); *B60K 2370/174* (2019.05); *B60K 2370/186* (2019.05); *B60L 2240/54* (2013.01); *B60L 2240/545* (2013.01); *B60L 2240/66* (2013.01); *B60L 2260/44* (2013.01); *Y02T 10/7005* (2013.01); *Y02T 10/7044* (2013.01); *Y02T 10/7055* (2013.01)

(58) Field of Classification Search
CPC combination set(s) only.
See application file for complete search history.

(56) References Cited

U.S. PATENT DOCUMENTS

| | | | | |
|---|---|---|---|---|
| 2013/0179061 | A1* | 7/2013 | Gadh | B60L 11/1842 701/123 |
| 2015/0360578 | A1* | 12/2015 | Duan | B60L 11/1861 340/455 |
| 2016/0137075 | A1 | 5/2016 | Zeng et al. | |
| 2016/0299197 | A1* | 10/2016 | Kim | B60L 58/10 |
| 2016/0347149 | A1* | 12/2016 | Rustoni | B60H 1/00771 |
| 2017/0331162 | A1* | 11/2017 | Clarke | G01R 31/3689 |

(Continued)

FOREIGN PATENT DOCUMENTS

CN 103337673 10/2013

OTHER PUBLICATIONS

U.S. Appl. No. 15/830,783, filed Dec. 4, 2017, Smith.
"State of Health (SOH) Determination, What is the SOH?," Woodbank Communications Ltd, 2005, 3 pages.

*Primary Examiner* — Jay Patidar
(74) *Attorney, Agent, or Firm* — Sheridan Ross P.C.

(57) ABSTRACT

Systems of an electrical vehicle and the operations thereof are provided. In particular, a vehicle is described with the ability to gather State of Charge (SOC) information as well as State of Health (SOH) information for one or more batteries in a vehicle and then display both SOC and SOH information to a driver of the vehicle as well as other interested parties. The displayed SOH information may be accompanied by suggestions to modify driving and/or charging behaviors that will improve or contribute to a slower degradation in the SOH of the batteries.

20 Claims, 14 Drawing Sheets

(56) References Cited

U.S. PATENT DOCUMENTS

2018/0106869 A1* 4/2018 Gelso ................. G01R 31/3651
2018/0134171 A1* 5/2018 Hyde .................. B60L 11/1861
2018/0143262 A1* 5/2018 Kondo ............... G01R 31/3679
2019/0004118 A1* 1/2019 Eichelberger ...... G01R 31/3651

* cited by examiner

REPORTING OF VEHICLE BATTERY STATE OF HEALTH AND CHARGE

FIELD

The present disclosure is generally directed to vehicle systems, in particular, toward electric and/or hybrid-electric vehicles.

BACKGROUND

In recent years, transportation methods have changed substantially. This change is due in part to a concern over the limited availability of natural resources, a proliferation in personal technology, and a societal shift to adopt more environmentally-friendly transportation solutions. These considerations have encouraged the development of a number of new flexible-fuel vehicles, hybrid-electric vehicles, and electric vehicles.

While these vehicles appear to be new they are generally implemented as a number of traditional subsystems that are merely tied to an alternative power source. In fact, the design and construction of the vehicles is limited to standard frame sizes, shapes, materials, and transportation concepts. Among other things, these limitations fail to take advantage of the benefits of new technology, power sources, and support infrastructure.

DETAILED DESCRIPTION

Embodiments of the present disclosure will be described in connection with a vehicle, and in some embodiments, an electric vehicle, rechargeable electric vehicle, and/or hybrid-electric vehicle and associated systems.

Figure 1:
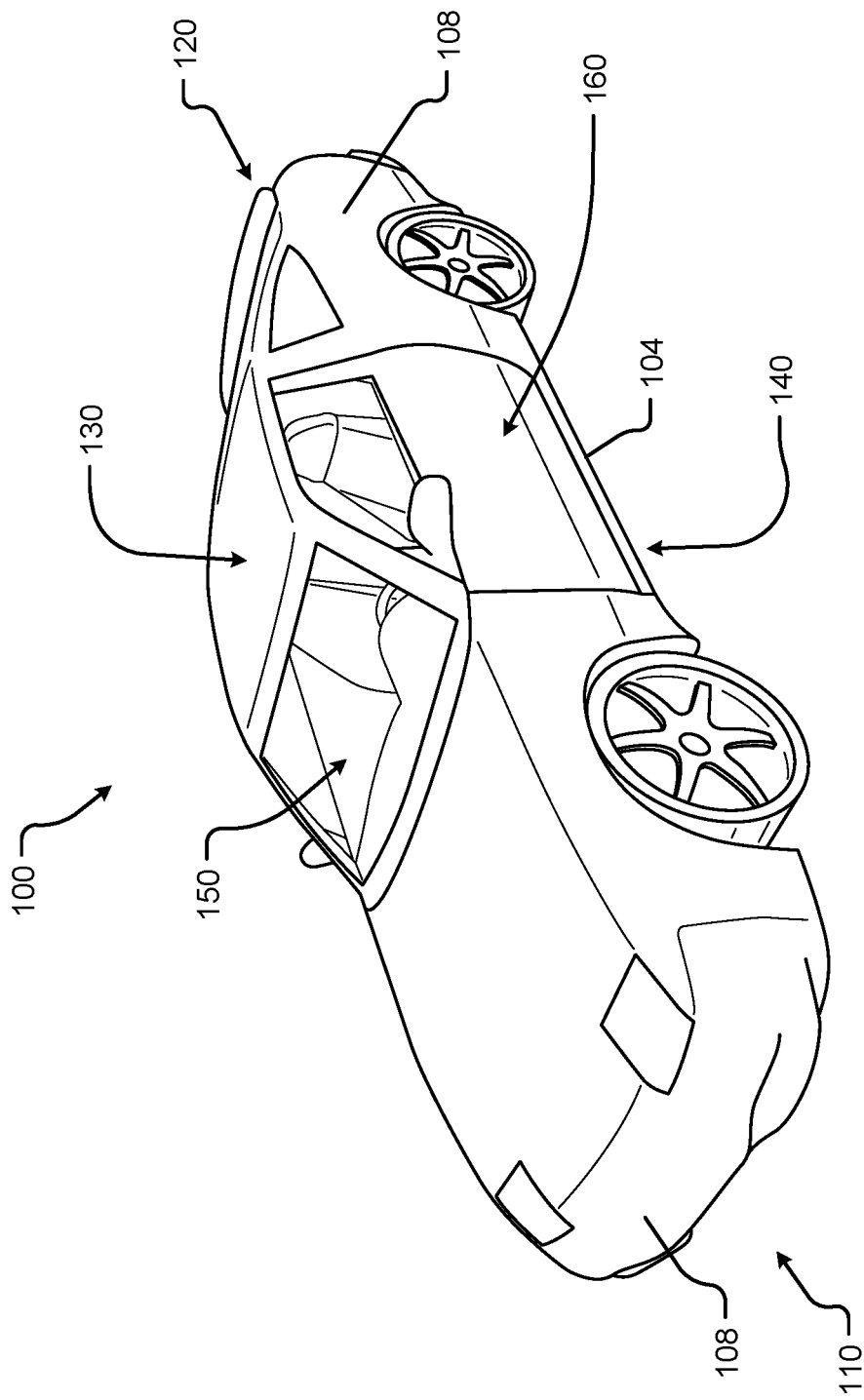
FIG. 1 shows a vehicle in accordance with embodiments of the present disclosure.

FIG. 1 shows a perspective view of a vehicle 100 in accordance with embodiments of the present disclosure. The electric vehicle 100 comprises a vehicle front 110, vehicle aft 120, vehicle roof 130, at least one vehicle side 160, a vehicle undercarriage 140, and a vehicle interior 150. In any event, the vehicle 100 may include a frame 104 and one or more body panels 108 mounted or affixed thereto. The vehicle 100 may include one or more interior components (e.g., components inside an interior space 150, or user space, of a vehicle 100, etc.), exterior components (e.g., components outside of the interior space 150, or user space, of a vehicle 100, etc.), drive systems, controls systems, structural components, etc.

Although shown in the form of a car, it should be appreciated that the vehicle 100 described herein may include any conveyance or model of a conveyance, where the conveyance was designed for the purpose of moving one or more tangible objects, such as people, animals, cargo, and the like. The term "vehicle" does not require that a conveyance moves or is capable of movement. Typical vehicles may include but are in no way limited to cars, trucks, motorcycles, busses, automobiles, trains, railed conveyances, boats, ships, marine conveyances, submarine conveyances, airplanes, space craft, flying machines, human-powered conveyances, and the like.

Figure 2:
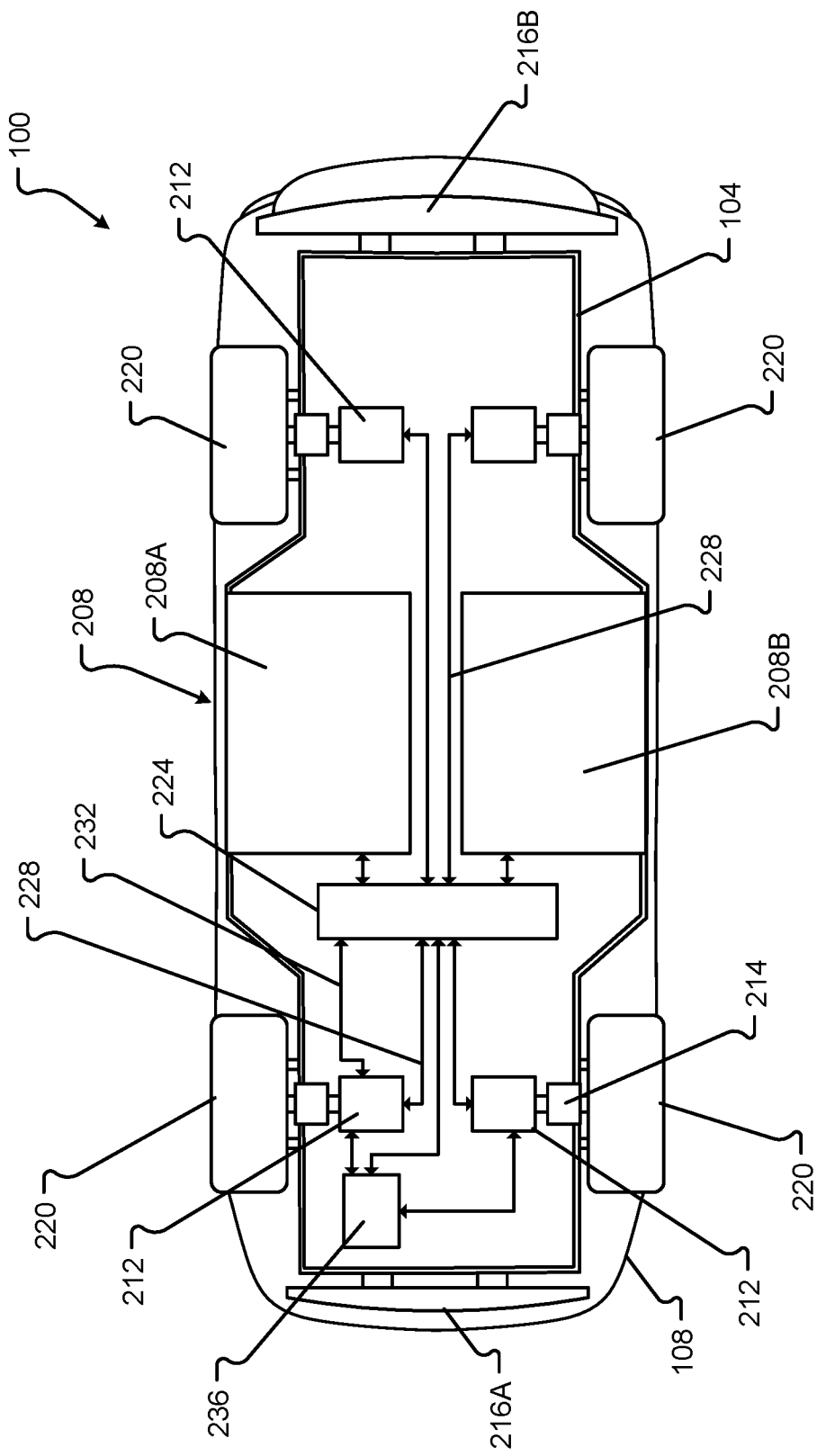
FIG. 2 shows a plan view of the vehicle in accordance with at least some embodiments of the present disclosure.

Referring now to FIG. 2, a plan view of a vehicle 100 will be described in accordance with embodiments of the present disclosure. As provided above, the vehicle 100 may comprise a number of electrical and/or mechanical systems, subsystems, etc. The mechanical systems of the vehicle 100 can include structural, power, safety, and communications subsystems, to name a few. While each subsystem may be described separately, it should be appreciated that the components of a particular subsystem may be shared between one or more other subsystems of the vehicle 100.

The structural subsystem includes the frame 104 of the vehicle 100. The frame 104 may comprise a separate frame and body construction (i.e., body-on-frame construction), a unitary frame and body construction (i.e., a unibody construction), or any other construction defining the structure of the vehicle 100. The frame 104 may be made from one or more materials including, but in no way limited to steel, titanium, aluminum, carbon fiber, plastic, polymers, etc., and/or combinations thereof. In some embodiments, the frame 104 may be formed, welded, fused, fastened, pressed, etc., combinations thereof, or otherwise shaped to define a physical structure and strength of the vehicle 100. In any event, the frame 104 may comprise one or more surfaces, connections, protrusions, cavities, mounting points, tabs, slots, or other features that are configured to receive other components that make up the vehicle 100. For example, the body panels 108, powertrain subsystem, controls systems, interior components, communications subsystem, and safety subsystem may interconnect with, or attach to, the frame 104 of the vehicle 100.

The frame 104 may include one or more modular system and/or subsystem connection mechanisms. These mechanisms may include features that are configured to provide a selectively interchangeable interface for one or more of the systems and/or subsystems described herein. The mechanisms may provide for a quick exchange, or swapping, of components while providing enhanced security and adaptability over conventional manufacturing or attachment. For instance, the ability to selectively interchange systems and/or subsystems in the vehicle 100 allow the vehicle 100 to adapt to the ever-changing technological demands of society and advances in safety. Among other things, the mechanisms may provide for the quick exchange of batteries, capacitors, power sources 208A, 208B, motors 212, engines, safety equipment, controllers, user interfaces, interiors exterior components, body panels 108, bumpers 216, sensors, etc., and/or combinations thereof. Additionally or alternatively, the mechanisms may provide unique security hardware and/or software embedded therein that, among other things, can prevent fraudulent or low quality construction replacements from being used in the vehicle 100. Similarly, the mechanisms, subsystems, and/or receiving features in the vehicle 100 may employ poka-yoke, or mistake-proofing, features that ensure a particular mechanism is always interconnected with the vehicle 100 in a correct position, function, etc.

By way of example, complete systems or subsystems may be removed and/or replaced from a vehicle 100 utilizing a single-minute exchange ("SME") principle. In some embodiments, the frame 104 may include slides, receptacles, cavities, protrusions, and/or a number of other features that allow for quick exchange of system components. In one embodiment, the frame 104 may include tray or ledge features, mechanical interconnection features, locking mechanisms, retaining mechanisms, etc., and/or combinations thereof. In some embodiments, it may be beneficial to quickly remove a used power source 208A, 208B (e.g., battery unit, capacitor unit, etc.) from the vehicle 100 and replace the used power source 208A, 208B with a charged or new power source. Continuing this example, the power source 208A, 208B may include selectively interchangeable features that interconnect with the frame 104 or other portion of the vehicle 100.

The power system of the vehicle 100 may include the powertrain, power distribution system, accessory power system, and/or any other components that store power, provide power, convert power, and/or distribute power to one or more portions of the vehicle 100. The powertrain may include the one or more electric motors 212 of the vehicle 100. The electric motors 212 are configured to convert electrical energy provided by a power source into mechanical energy. This mechanical energy may be in the form of a rotational or other output force that is configured to propel or otherwise provide a motive force for the vehicle 100.

In some embodiments, the vehicle 100 may include one or more drive wheels 220 that are driven by the one or more electric motors 212 and motor controllers 214. In some cases, the vehicle 100 may include an electric motor 212 configured to provide a driving force for each drive wheel 220. In other cases, a single electric motor 212 may be configured to share an output force between two or more drive wheels 220 via one or more power transmission components. It is an aspect of the present disclosure that the powertrain may include one or more power transmission components, motor controllers 214, and/or power controllers that can provide a controlled output of power to one or more of the drive wheels 220 of the vehicle 100. The power transmission components, power controllers, or motor controllers 214 may be controlled by at least one other vehicle controller or computer system as described herein.

As provided above, the powertrain of the vehicle 100 may include one or more power sources 208A, 208B. These one or more power sources 208A, 208B may be configured to provide drive power, system and/or subsystem power, accessory power, etc. While described herein as a single power source 208 for sake of clarity, embodiments of the present disclosure are not so limited. For example, it should be appreciated that independent, different, or separate power sources 208A, 208B may provide power to various systems of the vehicle 100. For instance, a drive power source may be configured to provide the power for the one or more electric motors 212 of the vehicle 100, while a system power source may be configured to provide the power for one or more other systems and/or subsystems of the vehicle 100. Other power sources may include an accessory power source, a backup power source, a critical system power source, and/or other separate power sources. Separating the power sources 208A, 208B in this manner may provide a number of benefits over conventional vehicle systems. For example, separating the power sources 208A, 208B allow one power source 208 to be removed and/or replaced independently without requiring that power be removed from all systems and/or subsystems of the vehicle 100 during a power source 208 removal/replacement. For instance, one or more of the accessories, communications, safety equipment, and/or backup power systems, etc., may be maintained even when a particular power source 208A, 208B is depleted, removed, or becomes otherwise inoperable.

In some embodiments, the drive power source may be separated into two or more cells, units, sources, and/or systems. By way of example, a vehicle 100 may include a first drive power source 208A and a second drive power source 208B. The first drive power source 208A may be operated independently from or in conjunction with the second drive power source 208B and vice versa. Continuing this example, the first drive power source 208A may be removed from a vehicle while a second drive power source 208B can be maintained in the vehicle 100 to provide drive power. This approach allows the vehicle 100 to significantly reduce weight (e.g., of the first drive power source 208A, etc.) and improve power consumption, even if only for a temporary period of time.

The power source 208 may include a GPS or other geographical location system that may be configured to emit a location signal to one or more receiving entities. For instance, the signal may be broadcast or targeted to a specific receiving party. Additionally or alternatively, the power source 208 may include a unique identifier that may be used to associate the power source 208 with a particular vehicle 100 or vehicle user. This unique identifier may allow an efficient recovery of the power source 208 dropped off. In some embodiments, the unique identifier may provide information for the particular vehicle 100 or vehicle user to be billed or charged with a cost of recovery for the power source 208.

The power source 208 may include a charge controller 224 that may be configured to determine charge levels of the power source 208, control a rate at which charge is drawn from the power source 208, control a rate at which charge is added to the power source 208, and/or monitor a health of the power source 208 (e.g., one or more cells, portions, etc.). In some embodiments, the charge controller 224 or the power source 208 may include a communication interface. The communication interface can allow the charge controller 224 to report a state of the power source 208 to one or more other controllers of the vehicle 100 or even communicate with a communication device separate and/or apart from the vehicle 100. Additionally or alternatively, the communication interface may be configured to receive instructions (e.g., control instructions, charge instructions, communication instructions, etc.) from one or more other controllers or computers of the vehicle 100 or a communication device that is separate and/or apart from the vehicle 100.

The powertrain includes one or more power distribution systems configured to transmit power from the power source 208 to one or more electric motors 212 in the vehicle 100. The power distribution system may include electrical interconnections 228 in the form of cables, wires, traces, wireless power transmission systems, etc., and/or combinations thereof. It is an aspect of the present disclosure that the vehicle 100 include one or more redundant electrical interconnections 232 of the power distribution system. The redundant electrical interconnections 232 can allow power to be distributed to one or more systems and/or subsystems of the vehicle 100 even in the event of a failure of an electrical interconnection portion of the vehicle 100 (e.g., due to an accident, mishap, tampering, or other harm to a particular electrical interconnection, etc.). In some embodiments, a user of a vehicle 100 may be alerted via a user interface associated with the vehicle 100 that a redundant electrical interconnection 232 is being used and/or damage has occurred to a particular area of the vehicle electrical system. In any event, the one or more redundant electrical interconnections 232 may be configured along completely different routes than the electrical interconnections 228 and/or include different modes of failure than the electrical interconnections 228 to, among other things, prevent a total interruption power distribution in the event of a failure.

In some embodiments, the power distribution system may include an energy recovery system 236. This energy recovery system 236, or kinetic energy recovery system, may be configured to recover energy produced by the movement of a vehicle 100. The recovered energy may be stored as electrical and/or mechanical energy. For instance, as a vehicle 100 travels or moves, a certain amount of energy is required to accelerate, maintain a speed, stop, or slow the vehicle 100. In any event, a moving vehicle has a certain amount of kinetic energy. When brakes are applied in a typical moving vehicle, most of the kinetic energy of the vehicle is lost as the generation of heat in the braking mechanism. In an energy recovery system 236, when a vehicle 100 brakes, at least a portion of the kinetic energy is converted into electrical and/or mechanical energy for storage. Mechanical energy may be stored as mechanical movement (e.g., in a flywheel, etc.) and electrical energy may be stored in batteries, capacitors, and/or some other electrical storage system. In some embodiments, electrical energy recovered may be stored in the power source 208. For example, the recovered electrical energy may be used to charge the power source 208 of the vehicle 100.

The vehicle 100 may include one or more safety systems. Vehicle safety systems can include a variety of mechanical and/or electrical components including, but in no way limited to, low impact or energy-absorbing bumpers 216A, 216B, crumple zones, reinforced body panels, reinforced frame components, impact bars, power source containment zones, safety glass, seatbelts, supplemental restraint systems, air bags, escape hatches, removable access panels, impact sensors, accelerometers, vision systems, radar systems, etc., and/or the like. In some embodiments, the one or more of the safety components may include a safety sensor or group of safety sensors associated with the one or more of the safety components. For example, a crumple zone may include one or more strain gages, impact sensors, pressure transducers, etc. These sensors may be configured to detect or determine whether a portion of the vehicle 100 has been subjected to a particular force, deformation, or other impact. Once detected, the information collected by the sensors may be transmitted or sent to one or more of a controller of the vehicle 100 (e.g., a safety controller, vehicle controller, etc.) or a communication device associated with the vehicle 100 (e.g., across a communication network, etc.).

Figure 3:
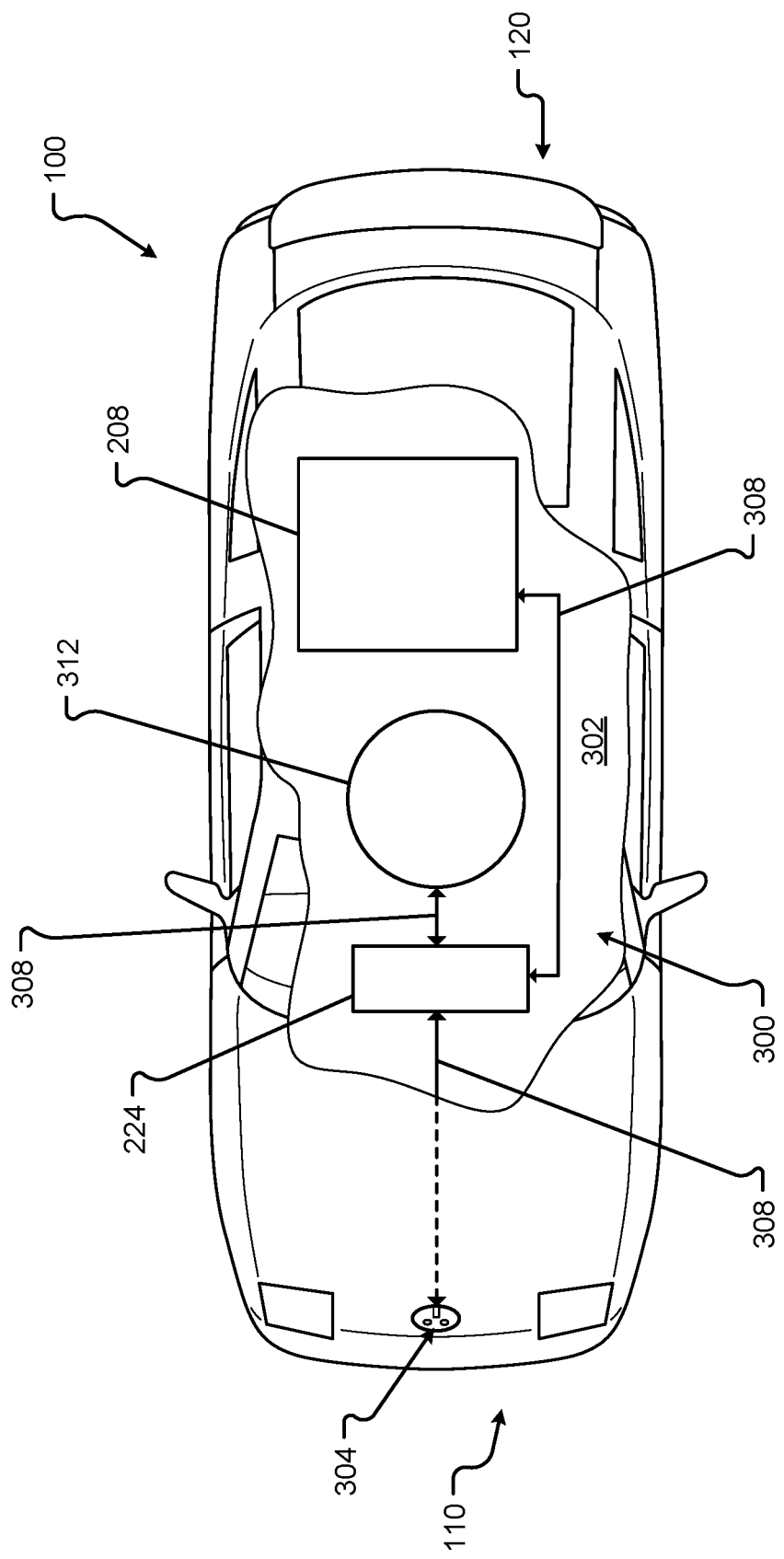
FIG. 3 shows a plan view of the vehicle in accordance with embodiments of the present disclosure

FIG. 3 shows a plan view of the vehicle 100 in accordance with embodiments of the present disclosure. In particular, FIG. 3 shows a broken section 302 of a charging system 300 for the vehicle 100. The charging system 300 may include a plug or receptacle 304 configured to receive power from an external power source (e.g., a source of power that is external to and/or separate from the vehicle 100, etc.). An example of an external power source may include the standard industrial, commercial, or residential power that is provided across power lines. Another example of an external power source may include a proprietary power system configured to provide power to the vehicle 100. In any event, power received at the plug/receptacle 304 may be transferred via at least one power transmission interconnection 308. Similar, if not identical, to the electrical interconnections 228 described above, the at least one power transmission interconnection 308 may be one or more cables, wires, traces, wireless power transmission systems, etc., and/or combinations thereof. Electrical energy in the form of charge can be transferred from the external power source to the charge controller 224. As provided above, the charge controller 224 may regulate the addition of charge to at least one power source 208 of the vehicle 100 (e.g., until the at least one power source 208 is full or at a capacity, etc.).

In some embodiments, the vehicle 100 may include an inductive charging system and inductive charger 312. The inductive charger 312 may be configured to receive electrical energy from an inductive power source external to the vehicle 100. In one embodiment, when the vehicle 100 and/or the inductive charger 312 is positioned over an inductive power source external to the vehicle 100, electrical energy can be transferred from the inductive power source to the vehicle 100. For example, the inductive charger 312 may receive the charge and transfer the charge via at least one power transmission interconnection 308 to the charge controller 324 and/or the power source 208 of the vehicle 100. The inductive charger 312 may be concealed in a portion of the vehicle 100 (e.g., at least partially protected by the frame 104, one or more body panels 108, a shroud, a shield, a protective cover, etc., and/or combinations thereof) and/or may be deployed from the vehicle 100. In some embodiments, the inductive charger 312 may be configured to receive charge only when the inductive charger 312 is deployed from the vehicle 100. In other embodiments, the inductive charger 312 may be configured to receive charge while concealed in the portion of the vehicle 100.

In addition to the mechanical components described herein, the vehicle 100 may include a number of user interface devices. The user interface devices receive and translate human input into a mechanical movement or electrical signal or stimulus. The human input may be one or more of motion (e.g., body movement, body part movement, in two-dimensional or three-dimensional space, etc.), voice, touch, and/or physical interaction with the components of the vehicle 100. In some embodiments, the human input may be configured to control one or more functions of the vehicle 100 and/or systems of the vehicle 100 described herein. User interfaces may include, but are in no way limited to, at least one graphical user interface of a display device, steering wheel or mechanism, transmission lever or button (e.g., including park, neutral, reverse, and/or drive positions, etc.), throttle control pedal or mechanism, brake control pedal or mechanism, power control switch, communications equipment, etc.

Figure 4:
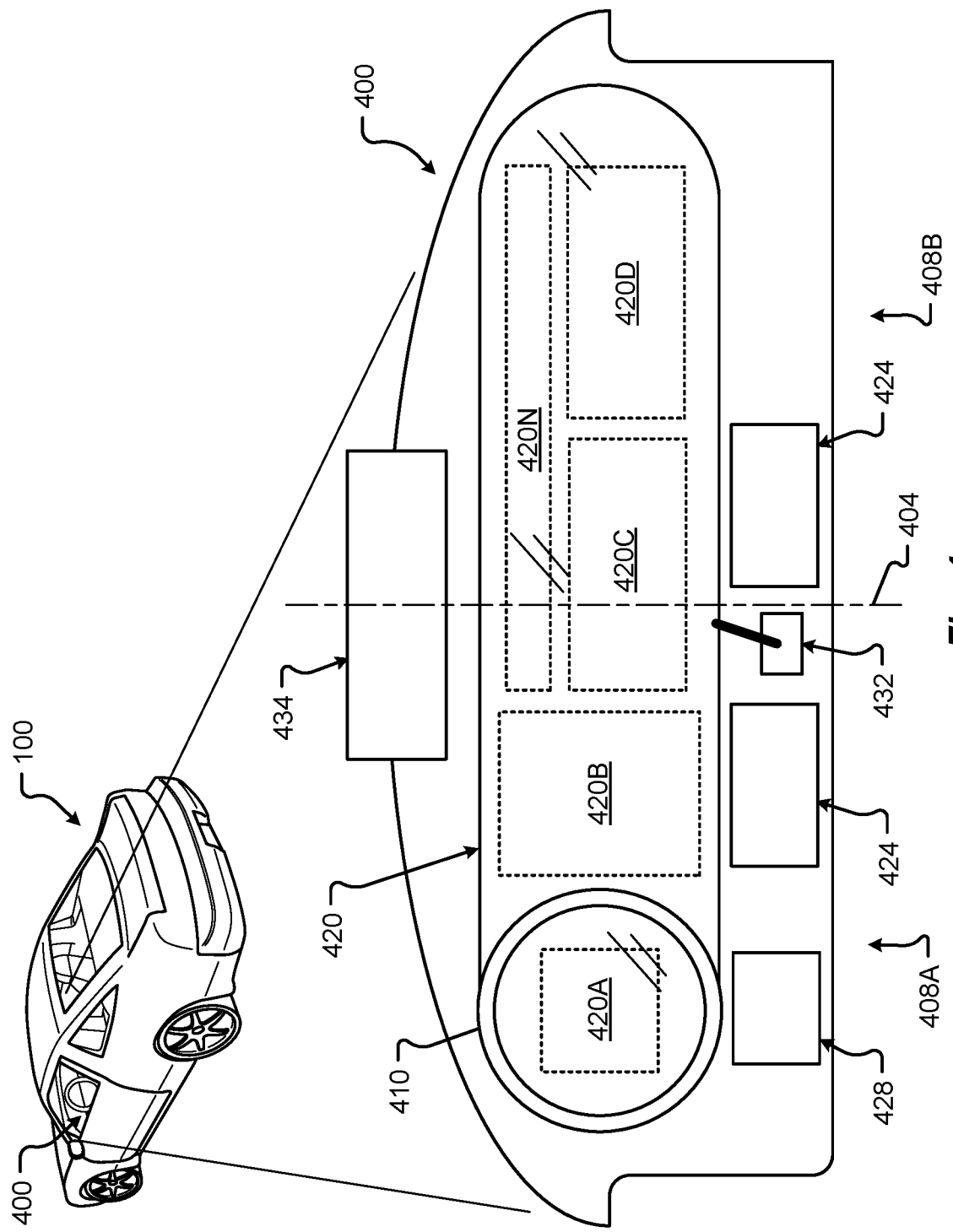
FIG. 4 shows an embodiment of the instrument panel of the vehicle according to one embodiment of the present disclosure.

FIG. 4 shows one embodiment of the instrument panel 400 of the vehicle 100. The instrument panel 400 of vehicle 100 comprises a steering wheel 410, a vehicle operational display 420 (e.g., configured to present and/or display driving data such as speed, measured air resistance, vehicle information, entertainment information, etc.), one or more auxiliary displays 424 (e.g., configured to present and/or display information segregated from the operational display 420, entertainment applications, movies, music, etc.), a heads-up display 434 (e.g., configured to display any information previously described including, but in no way limited to, guidance information such as route to destination, or obstacle warning information to warn of a potential collision, or some or all primary vehicle operational data such as speed, resistance, etc.), a power management display 428 (e.g., configured to display data corresponding to electric power levels of vehicle 100, reserve power, charging status, etc.), and an input device 432 (e.g., a controller, touchscreen, or other interface device configured to interface with one or more displays in the instrument panel or components of the vehicle 100. The input device 432 may be configured as a joystick, mouse, touchpad, tablet, 3D gesture capture device, etc.). In some embodiments, the input device 432 may be used to manually maneuver a portion of the vehicle 100 into a charging position (e.g., moving a charging plate to a desired separation distance, etc.).

While one or more of displays of instrument panel 400 may be touch-screen displays, it should be appreciated that the vehicle operational display may be a display incapable of receiving touch input. For instance, the operational display 420 that spans across an interior space centerline 404 and across both a first zone 408A and a second zone 408B may be isolated from receiving input from touch, especially from a passenger. In some cases, a display that provides vehicle operation or critical systems information and interface may be restricted from receiving touch input and/or be configured as a non-touch display. This type of configuration can prevent dangerous mistakes in providing touch input where such input may cause an accident or unwanted control.

In some embodiments, one or more displays of the instrument panel 400 may be mobile devices and/or applications residing on a mobile device such as a smart phone. Additionally or alternatively, any of the information described herein may be presented to one or more portions 420A-N of the operational display 420 or other display 424, 428, 434. In one embodiment, one or more displays of the instrument panel 400 may be physically separated or detached from the instrument panel 400. In some cases, a detachable display may remain tethered to the instrument panel.

The portions 420A-N of the operational display 420 may be dynamically reconfigured and/or resized to suit any display of information as described. Additionally or alternatively, the number of portions 420A-N used to visually present information via the operational display 420 may be dynamically increased or decreased as required, and are not limited to the configurations shown.

Figure 5:
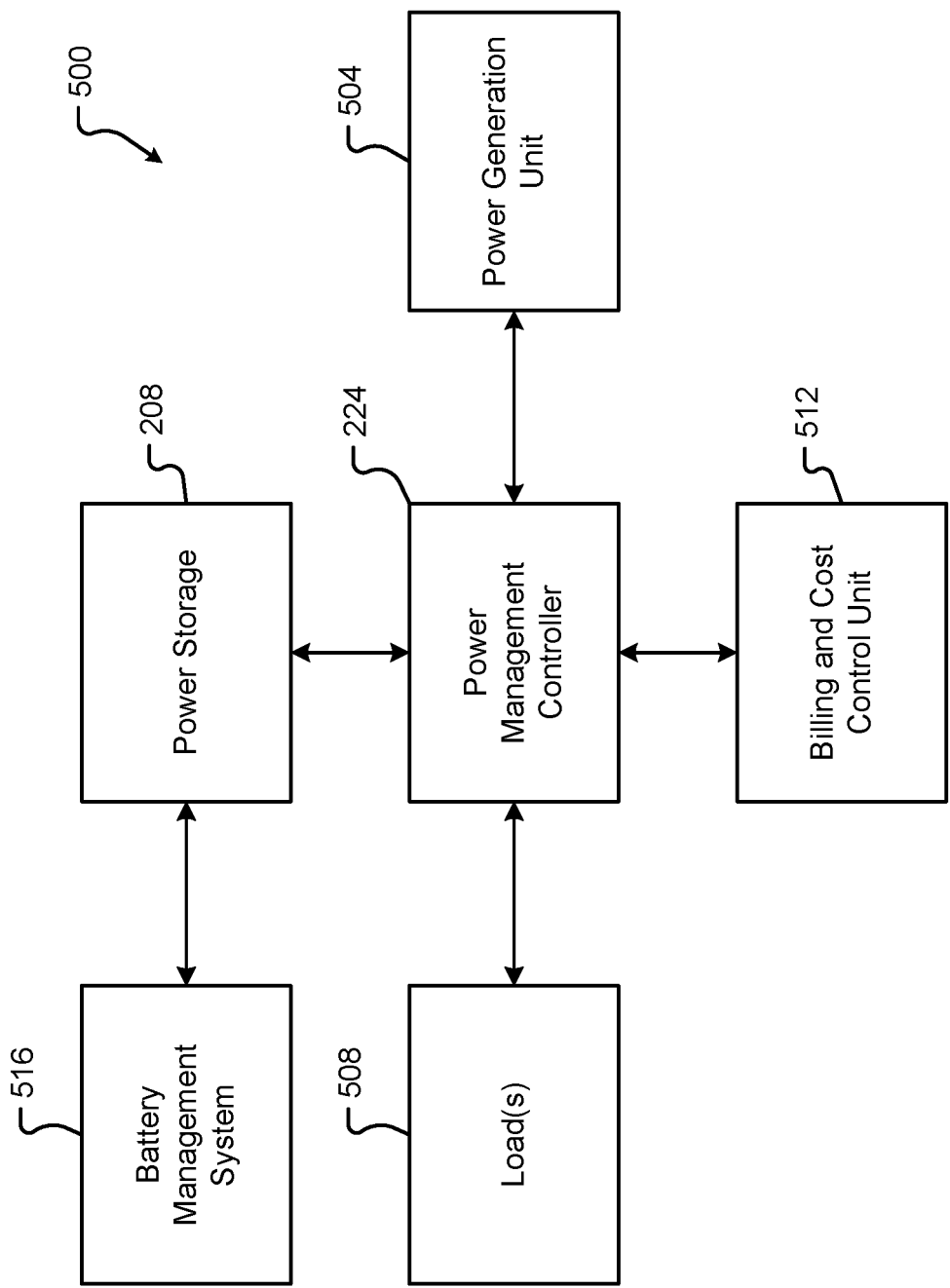
FIG. 5 is a block diagram of an embodiment of an electrical system of the vehicle.

An embodiment of the electrical system 500 associated with the vehicle 100 may be as shown in FIG. 5. The electrical system 500 can include power source(s) that generate power, power storage that stores power, and/or load(s) that consume power. Power sources may be associated with a power generation unit 504. Power storage may be associated with a power storage system 208. Loads may be associated with loads 508. The electrical system 500 may be managed by a power management controller 224. Further, the electrical system 500 can include one or more other interfaces or controllers, which can include the billing and cost control unit 512.

The billing and cost control unit 512 may interface with the power management controller 224 to determine the amount of charge or power provided to the power storage 208 through the power generation unit 504. The billing and cost control unit 512 can then provide information for billing the vehicle owner. Thus, the billing and cost control unit 512 can receive and/or send power information to third party system(s) regarding the received charge from an external source. The information provided can help determine an amount of money required, from the owner of the vehicle, as payment for the provided power. Alternatively, or in addition, if the owner of the vehicle provided power to another vehicle (or another device/system), that owner may be owed compensation for the provided power or energy, e.g., a credit.

The power management controller 224 can be a computer or computing system(s) and/or electrical system with associated components, as described herein, capable of managing the power generation unit 504 to receive power, routing the power to the power storage 208, and then providing the power from either the power generation unit 504 and/or the power storage 208 to the loads 508. Thus, the power management controller 224 may execute programming that controls switches, devices, components, etc. involved in the reception, storage, and provision of the power in the electrical system 500.

In some embodiments, a energy management system 516 is also in communication with or monitoring the utilization of the power storage 208 (or constituent parts thereof). While depicted as being separate from the power management controller 224, it should be appreciated that the energy management system 516 may be incorporated in or provided as part of the power management controller 224. The energy management system 516 may be responsible for monitoring power storage 208 (e.g., battery cells, modules, packs, or the like) in an effort to determine both the State of Charge (SOC) for the power storage 208 and/or State of Health (SOH) for the power storage 208. The energy management system 516 may further monitor the operational performance of the power storage 208 (e.g., by monitoring voltage, resistance, capacitance, charge time, number of charges, charge dissipation, etc.) by accessing one or more sensors. The operational performance information can then be converted into SOC information and SOH information. As will be discussed in further detail herein, the SOC information and SOH information can be reported (in part or entirely) to an operator of the vehicle 100 as well as to other remote servers.

Figure 6:
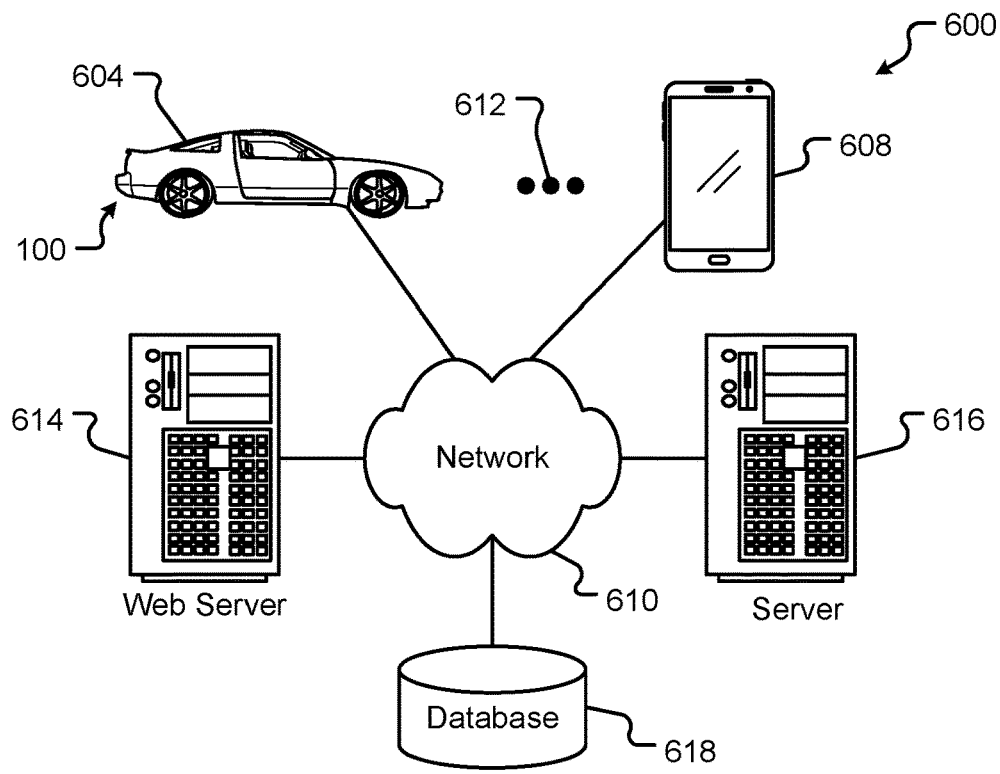
FIG. 6 is a block diagram a computing environment associated with the embodiments presented herein.

FIG. 6 illustrates a block diagram of a computing environment 600 that may function as the servers, user computers, or other systems provided and described herein. The environment 600 includes one or more user computers, or computing devices, such as a vehicle computing device 604, a communication device 608, and/or more 612. The computing devices 604, 608, 612 may include general purpose personal computers (including, merely by way of example, personal computers, and/or laptop computers running various versions of Microsoft Corp.'s Windows® and/or Apple Corp.'s Macintosh® operating systems) and/or workstation computers running any of a variety of commercially-available UNIX® or UNIX-like operating systems. These computing devices 604, 608, 612 may also have any of a variety of applications, including for example, database client and/or server applications, and web browser applications. Alternatively, the computing devices 604, 608, 612 may be any other electronic device, such as a thin-client computer, Internet-enabled mobile telephone, and/or personal digital assistant, capable of communicating via a network 610 and/or displaying and navigating web pages or other types of electronic documents. Although the exemplary computer environment 600 is shown with two computing devices, any number of user computers or computing devices may be supported.

Environment 600 further includes a network 610. The network 610 may can be any type of network familiar to those skilled in the art that can support data communications using any of a variety of commercially-available protocols, including without limitation SIP, TCP/IP, SNA, IPX, AppleTalk, and the like. Merely by way of example, the network 610 maybe a local area network ("LAN"), such as an Ethernet network, a Token-Ring network and/or the like; a wide-area network; a virtual network, including without limitation a virtual private network ("VPN"); the Internet; an intranet; an extranet; a public switched telephone network ("PSTN"); an infra-red network; a wireless network (e.g., a network operating under any of the IEEE 802.9 suite of protocols, the Bluetooth® protocol known in the art, and/or any other wireless protocol); and/or any combination of these and/or other networks.

The system may also include one or more servers 614, 616. In this example, server 614 is shown as a web server and server 616 is shown as an application server. The web server 614, which may be used to process requests for web pages or other electronic documents from computing devices 604, 608, 612. The web server 614 can be running an operating system including any of those discussed above, as well as any commercially-available server operating systems. The web server 614 can also run a variety of server applications, including SIP (Session Initiation Protocol) servers, HTTP(s) servers, FTP servers, CGI servers, database servers, Java servers, and the like. In some instances, the web server 614 may publish operations available operations as one or more web services.

The environment 600 may also include one or more file and or/application servers 616, which can, in addition to an operating system, include one or more applications accessible by a client running on one or more of the computing devices 604, 608, 612. The server(s) 616 and/or 614 may be one or more general purpose computers capable of executing programs or scripts in response to the computing devices 604, 608, 612. As one example, the server 616, 614 may execute one or more web applications. The web application may be implemented as one or more scripts or programs written in any programming language, such as Java™, C, C#®, or C++, and/or any scripting language, such as Perl, Python, or TCL, as well as combinations of any programming/scripting languages. The application server(s) 616 may also include database servers, including without limitation those commercially available from Oracle®, Microsoft®, Sybase®, IBM® and the like, which can process requests from database clients running on a computing device 604, 608, 612.

The web pages created by the server 614 and/or 616 may be forwarded to a computing device 604, 608, 612 via a web (file) server 614, 616. Similarly, the web server 614 may be able to receive web page requests, web services invocations, and/or input data from a computing device 604, 608, 612 (e.g., a user computer, etc.) and can forward the web page requests and/or input data to the web (application) server 616. In further embodiments, the server 616 may function as a file server. Although for ease of description, FIG. 10 illustrates a separate web server 614 and file/application server 616, those skilled in the art will recognize that the functions described with respect to servers 614, 616 may be performed by a single server and/or a plurality of specialized servers, depending on implementation-specific needs and parameters. The computer systems 604, 608, 612, web (file) server 614 and/or web (application) server 616 may function as the system, devices, or components described in FIGS. 1-10.

The environment 600 may also include a database 618. The database 618 may reside in a variety of locations. By way of example, database 618 may reside on a storage medium local to (and/or resident in) one or more of the computers 604, 608, 612, 614, 616. Alternatively, it may be remote from any or all of the computers 604, 608, 612, 614, 616, and in communication (e.g., via the network 610) with one or more of these. The database 618 may reside in a storage-area network ("SAN") familiar to those skilled in the art. Similarly, any necessary files for performing the functions attributed to the computers 604, 608, 612, 614, 616 may be stored locally on the respective computer and/or remotely, as appropriate. The database 618 may be a relational database, such as Oracle 20i®, that is adapted to store, update, and retrieve data in response to SQL-formatted commands.

Figure 7:
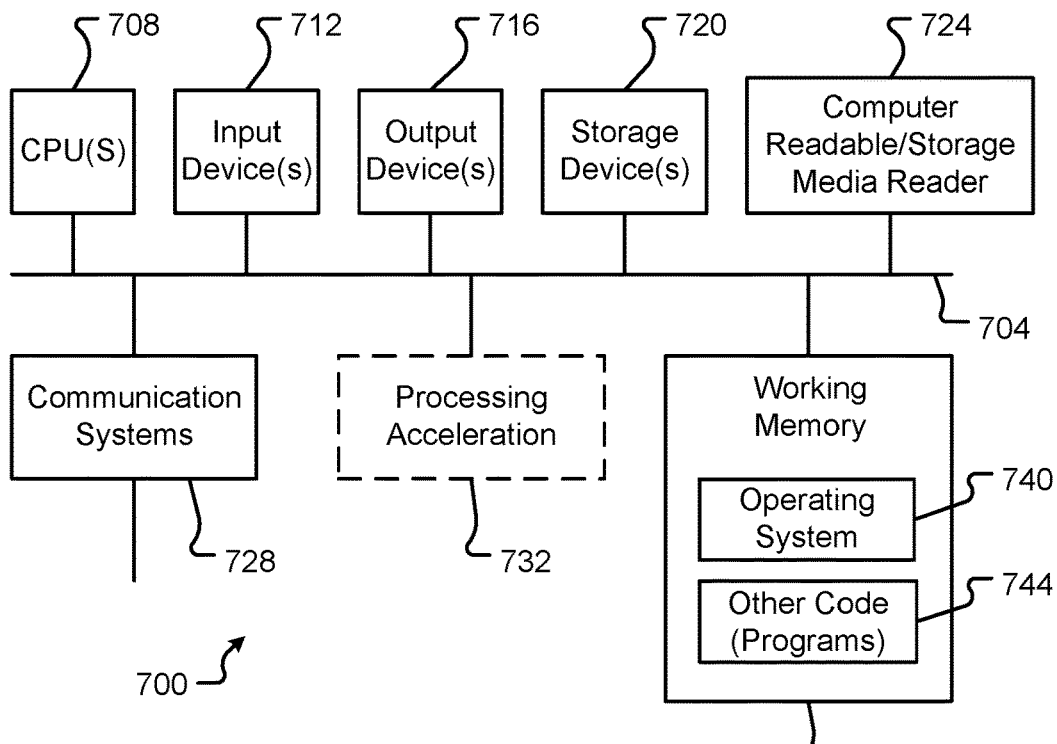
FIG. 7 is a block diagram of a computing device associated with one or more components described herein.

FIG. 7 illustrates one embodiment of a computer system 700 upon which the servers, user computers, computing devices, or other systems or components described above may be deployed or executed. The computer system 700 is shown comprising hardware elements that may be electrically coupled via a bus 704. The hardware elements may include one or more central processing units (CPUs) 708; one or more input devices 712 (e.g., a mouse, a keyboard, etc.); and one or more output devices 716 (e.g., a display device, a printer, etc.). The computer system 700 may also include one or more storage devices 720. By way of example, storage device(s) 720 may be disk drives, optical storage devices, solid-state storage devices such as a random access memory ("RAM") and/or a read-only memory ("ROM"), which can be programmable, flash-updateable and/or the like.

The computer system 700 may additionally include a computer-readable storage media reader 724; a communications system 728 (e.g., a modem, a network card (wireless or wired), an infra-red communication device, etc.); and working memory 736, which may include RAM and ROM devices as described above. The computer system 700 may also include a processing acceleration unit 732, which can include a DSP, a special-purpose processor, and/or the like.

The computer-readable storage media reader 724 can further be connected to a computer-readable storage medium, together (and, optionally, in combination with storage device(s) 720) comprehensively representing remote, local, fixed, and/or removable storage devices plus storage media for temporarily and/or more permanently containing computer-readable information. The communications system 728 may permit data to be exchanged with a network and/or any other computer described above with respect to the computer environments described herein. Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information.

The computer system 700 may also comprise software elements, shown as being currently located within a working memory 736, including an operating system 740 and/or other code 744. It should be appreciated that alternate embodiments of a computer system 700 may have numerous variations from that described above. For example, customized hardware might also be used and/or particular elements might be implemented in hardware, software (including portable software, such as applets), or both. Further, connection to other computing devices such as network input/output devices may be employed.

Examples of the processors 708 as described herein may include, but are not limited to, at least one of Qualcomm® Snapdragon® 800 and 801, Qualcomm® Snapdragon® 620 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, other industry-equivalent processors, and may perform computational functions using any known or future-developed standard, instruction set, libraries, and/or architecture.

Figure 8:
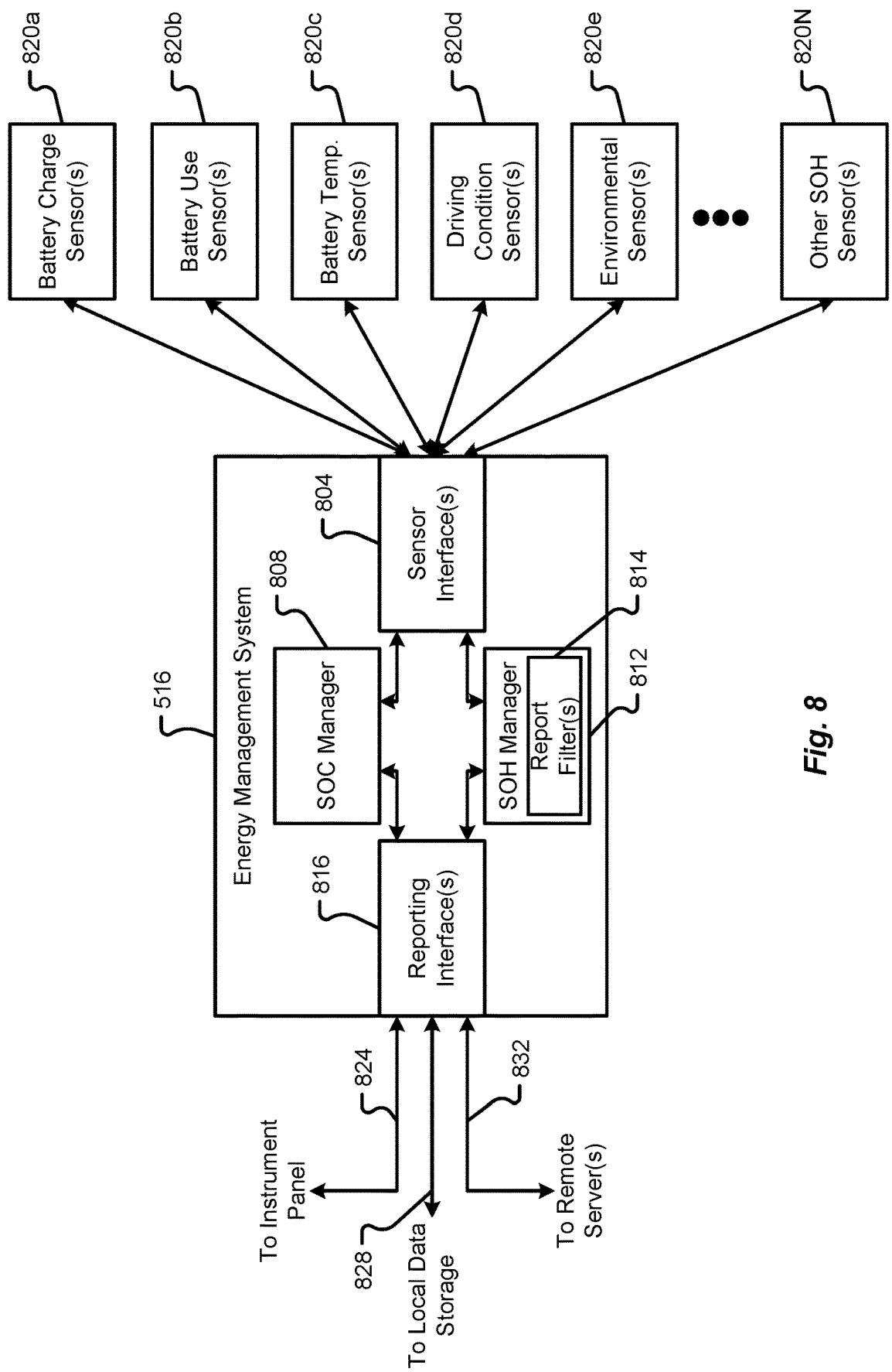
FIG. 8 is a block diagram of an energy management system in accordance with at least some embodiments of the present disclosure.

Referring now to FIG. 8, additional details of a energy management system 516 will be described in accordance with at least some embodiments of the present disclosure. The energy management system 516 is shown to include one or more sensor interfaces 804, an SOC manager 808, an SOH manager 812, and one or more reporting interfaces 816. The sensor interface(s) 804 enable the energy management system 804 to receive information from one or more battery state sensors 820a-N. In particular, different interfaces 804 may be provided for different sensors, depending upon the nature of the senor, the format of the sensor input provided to the energy management system 516, and other factors. Examples of sensors 820 that may provide input to the energy management system 516 include, without limitation, battery charge sensor(s) 820a, battery use sensor(s) 820b, battery temperature sensor(s) 820c, driving condition sensor(s) 820d, environmental sensor(s) 820e, and other SOH sensor(s) 820N. Information may be provided from the sensors to the energy management system 516 in the form of basic analog or digital signals. Alternatively or additionally, the sensor(s) 820a-N may provide voltage or current readouts that are converted by the sensor interface(s) 804 into an appropriate reading or data that represents an SOH condition. The sensor(s) 820a-N may provide sensor readings to the energy management system 516 on a continuous, periodic, non-periodic basis. In particular, readings from the sensor(s) may be provided to the energy management system 516 only in response to certain conditions being met (e.g., a change in measured state occurring) or the readings may be provided continuously without regard for any state change.

In some embodiments, the battery charge sensor(s) 820a may provide data indicative of a current charge state for a battery, cell, module, or any other type of power storage 208. The battery charge sensor(s) 820a may be used as a source of information about a current state of a battery. As such, information received from the battery charge sensor(s) 820a may be used by the SOC manager 808 to report current charge information for the batteries. Alternatively or additionally, the SOC manager 808 may take the information received from the battery charge sensor(s) 820a and convert that information into reportable information that describes a current state of the battery's charge (e.g., 50% charge remaining, 100% charged, 10% charge, etc.), a remaining range of the vehicle 100 (e.g., 100 miles to empty, 10 km to no charge, etc.), or the like. In some embodiments, the battery charge sensor(s) 820a may include a measurement system or collection of sensors that measure charge or discharge current flowing through a battery, voltage across battery terminals, and/or temperature of the battery itself. As such, the sensor(s) 820a may include one or many transducers that detect physical phenomena (e.g., temperature, current, voltage, etc.) and convert the detected physical phenomena into an output current, voltage, or similar type of electronic signal (which can be digital or analog). The sensor(s) 820a may include one or more shunts or shunt circuits that enable the sensing of battery currents. The sensor(s) 820a may also include one or more integrated processors that detect or determine a battery's SOC.

The battery use sensor(s) 820b, in some embodiments, may correspond to one or more transducers that help determine whether and/or to what extent batteries are being used. It may be possible to incorporate functionality of the battery use sensor(s) 820b into the battery charge sensor(s) 820a as changes in battery charge or SOC may signify that the battery is currently in use or has recently been used. A battery use sensor(s) 820b may help to determine, in a binary fashion, whether a battery is currently connected to a load, for example. A battery use sensor(s) 820b may also detect when a battery is not in use—again in a binary fashion. The battery use sensor(s) 820b may also detect which particular loads in the vehicle 100 are currently drawing power from a battery or set of batteries. In this way, the battery use sensor(s) 820b can help determine the operational loads being placed on batteries in addition to determining whether current is simply being drawn from the batteries. As can be appreciated, the battery use sensor(s) 820b can be incorporated into or nearby loads of the vehicle rather than the batteries themselves. Alternatively or additionally, the battery use sensor(s) 820b may be utilized to determine whether batteries are subjected to fast charges or normal charges. Knowledge of whether a battery is being subjected to a fast charge or normal charge can help to determine or predict future performance of a battery (e.g., excessive fast charges can negatively impact long-term battery performance including overall capacity, ability to maintain a full charge, etc.). Accordingly, as fast charges are detected at the battery use sensor(s) 820*b*, the SOH manager 812 may be notified of such information.

The battery temperature sensor(s) 820*c* may correspond to one or more thermal transducers that measure a physical temperature at or near a battery (or battery cell). The temperatures measured by the sensor(s) 820*c* may be in Fahrenheit, Celsius, etc. The temperature(s) measured by the sensor(s) 820*c* may be reported continuously or periodically without departing from the scope of the present disclosure.

The driving condition sensor(s) 820*d* may include one or many sensors that help detect the way in which a vehicle is being driven (e.g., via manual input, autonomously, semi-autonomously, etc.). The driving condition sensor(s) 820*d* may also detect routes driven by the vehicle 100, acceleration profiles, deceleration profiles, braking profiles, and the like. The driving condition sensor(s) 820*d* may include one or more accelerometers, GPS systems, motion sensors, rotation sensors, or the like. In particular, the driving sensor(s) 820*d* may help to collect information that describes how a vehicle 100 is being driven, which can be potentially correlated to battery performance. For instance, aggressive driving (e.g., driving in which significant accelerations and decelerations are performed) may result in degraded performance for a battery over its life due to significant and drastic swings in loads applied to the batteries.

The environmental sensor(s) 820*e* may include one or many sensors that are used to detect environmental conditions about the vehicle 100 and/or batteries. In particular, humidity, barometric pressure, temperature, and the like can be measured by the environmental sensor(s) 820*e*. The environmental conditions to which the batteries are subjected may impact their long-term performance (e.g., their SOH) and their possible performance degradation over time. The environmental sensor(s) 820*e* may, in some embodiments, help to detect conditions around the batteries as opposed to detecting conditions of the batteries themselves.

The other SOH sensor(s) 820N may include any other type of sensor or transducer that is useful in detecting conditions that might have an impact on battery SOH. For instance, sensors that detect battery or cell impedance, battery or cell conductance, battery or cell internal resistance, self-discharge, charge acceptance, and so on may be included on the other SOH sensor(s) 820N.

The energy management system 516 may accept the sensor inputs at the sensor interface(s) 804 and carry those inputs to one or both of the SOC manager 808 and SOH manager 812. As the names suggest, the SOC manager 808 is responsible for determining and reporting information related to battery SOC whereas the SOH manager 812 is responsible for determining and reporting information related to battery SOH.

As used herein, the SOH of a power source, battery, cell, module, or the like (generally referred to as a battery for ease of discussion) is a measurement or representation that reflects the general condition of a battery and its ability to deliver a specified performance compared with a fresh or new battery. Battery SOH takes into account such factors as charge acceptance, internal resistance, voltage and self-discharge. SOH is a measure of the long-term capability of the battery and gives an indication, rather than an absolute measurement, of how much of the available possible energy throughput of the battery has been consumed, and how much is left. Using the automotive analogy, the battery SOH for an electric or hybrid electric vehicle can be compared to the odometer display function which indicates the number of miles travelled since the vehicle was new.

As compared to SOH, the SOC of a battery represents the short-term capability of the battery. During the lifetime of a battery, its performance or health will deteriorate gradually due to irreversible physical and chemical changes which take place with usage (normal or abnormal) and with age until eventually the battery is no longer usable or dead. The SOH is an indication of the point which has been reached in the life cycle of the battery and a measure of its condition relative to a fresh or new battery. Unlike the SOC which can be determined by measuring the actual charge in the battery there is no absolute definition of the SOH. It is a subjective measure that can be derived from a variety of different measurable battery performance parameters which can be interpreted according to different rule sets. Accordingly, SOH is an estimation rather than a measurement; however, the more information related to SOH that is known or presented to a user may help in determining, with more accuracy, the relative SOH of a battery as compared to other battery SOHs. The SOH only applies to batteries after they have started their ageing process either on the shelf or once they have entered service.

In some embodiments, any parameter which changes significantly with age, such as cell impedance or conductance, can be used as a basis for providing an indication of the SOH of the cell. The types of battery or cell parameters which may be measured in connection with determining SOH include, without limitation, capacity, internal resistance, self-discharge, charge acceptance, discharge capabilities, mobility of electrolytes, and cycle-counting (e.g., number of charge and discharge cycles the battery or cell has been subjected to). The absolute readings of these parameters will likely depend on the cell chemistry involved. In some embodiments, weighting can be added to individual factors based on experience, the cell chemistry, and the importance the particular parameter in the application for which the battery is used. If any of these variables provide marginal readings, the end result will be affected. A battery may have a good capacity but the internal resistance is high. In this case, the SOH estimation will be lowered accordingly. Similar demerit points are added if the battery has high self-discharge or exhibits other chemical deficiencies. The points scored for the cell can be compared with the points assigned to a new cell to give a percentage result or figure of merit.

As can be appreciated, the logic employed by the SOC manager 808 may be relatively simple in that any information related to current battery charge can be received from the sensor interface 804 and promptly reported via the reporting interface(s) 816. The information reported by the SOC manager 808 may be provided to the instrument panel via signal path 824, to local data storage via signal path 828, and/or to remote server(s) via signal path 832. The SOC manager 808 may continuously or in response to requests report the current SOC for a battery, a set of batteries, or the like.

The SOH manager 812, on the other hand, may be responsible for receiving and processing the information from the sensor interface(s) 804 to calculate a SOH reading. Alternatively or additionally, the SOH manager 812 may apply one or more report filters 814 that enable the SOH manager 812 to simply report desired SOH information to desired recipients. The SOH manager 812, in some embodiments, may utilize its report filter(s) 814 to determine that a first set of SOH information is to be transmitted to the instrument panel via signal path 824 whereas a different set of SOH information is to be transmitted to local data storage via signal path 828. Similarly, the SOH manager 812 may utilize its report filters 814 to determine that a third set of SOH information is to be transmitted to remote server via signal path 832 for further processing and analysis.

As a non-limiting example, the SOH manager 812 may simply report a calculated SOH to the instrument panel for presentation to a driver of the vehicle 100, whereas the SOH manager 812 may report parameters used for calculating the SOH to local data storage and/or remote servers. The usefulness of sending the measured parameters rather than the calculated SOH value to the local data storage and/or remote servers is that the actual parameters can be logged and/or compared to previously-obtained parameters to determine long-term trends in each of the parameters. Analysis of the changes in parameters can help in determining a more accurate or representative SOH calculation. In some embodiments, it may be possible to send the SOH parameters to a remote server, which compares the parameters with historical readings of the same parameters, determines a current SOH calculation and then reports back the SOH calculation to the vehicle 100. The SOH calculation made at the remote server may then be presented to the drive of the vehicle 100 via the instrument panel 400.

As can be appreciated, the SOH manager 812 may utilize a plurality of different report filters 814 and each report filter may filter out certain types of information depending upon the desired recipient of the report, user preferences for such reports, and the like. The report filter(s) 814 may be user-configurable or configurable by manufacturers of the batteries. The report filter(s) 814 can be used to ensure that unnecessary or unwanted data is not sent along a particular signal path 824, 828, 832, thereby preserving network and/or processing resources.

Figure 9:
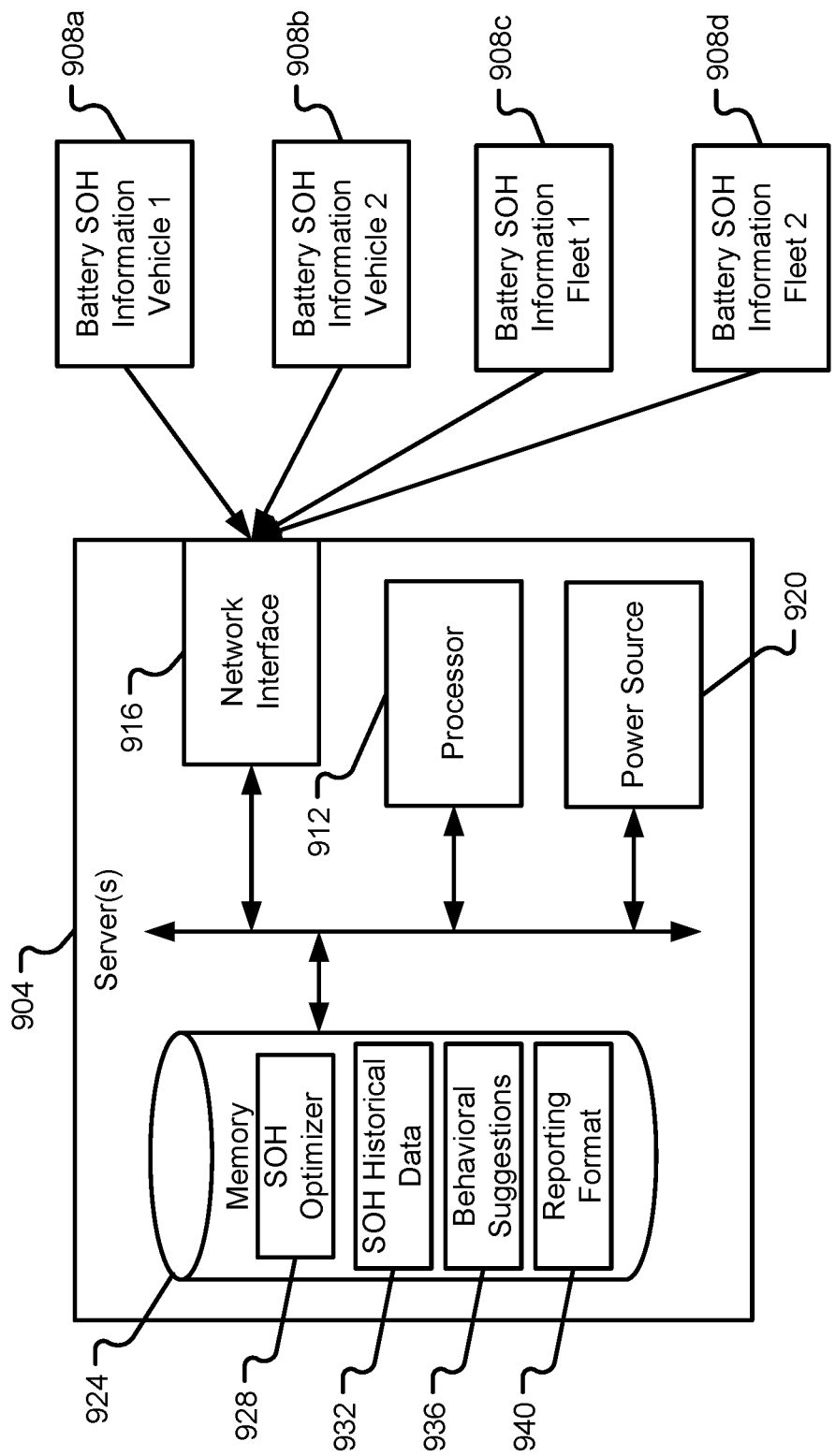
FIG. 9 is a block diagram of one or more servers implementing a State of Health optimizer in accordance with at least some embodiments of the present disclosure.
Figure 10:
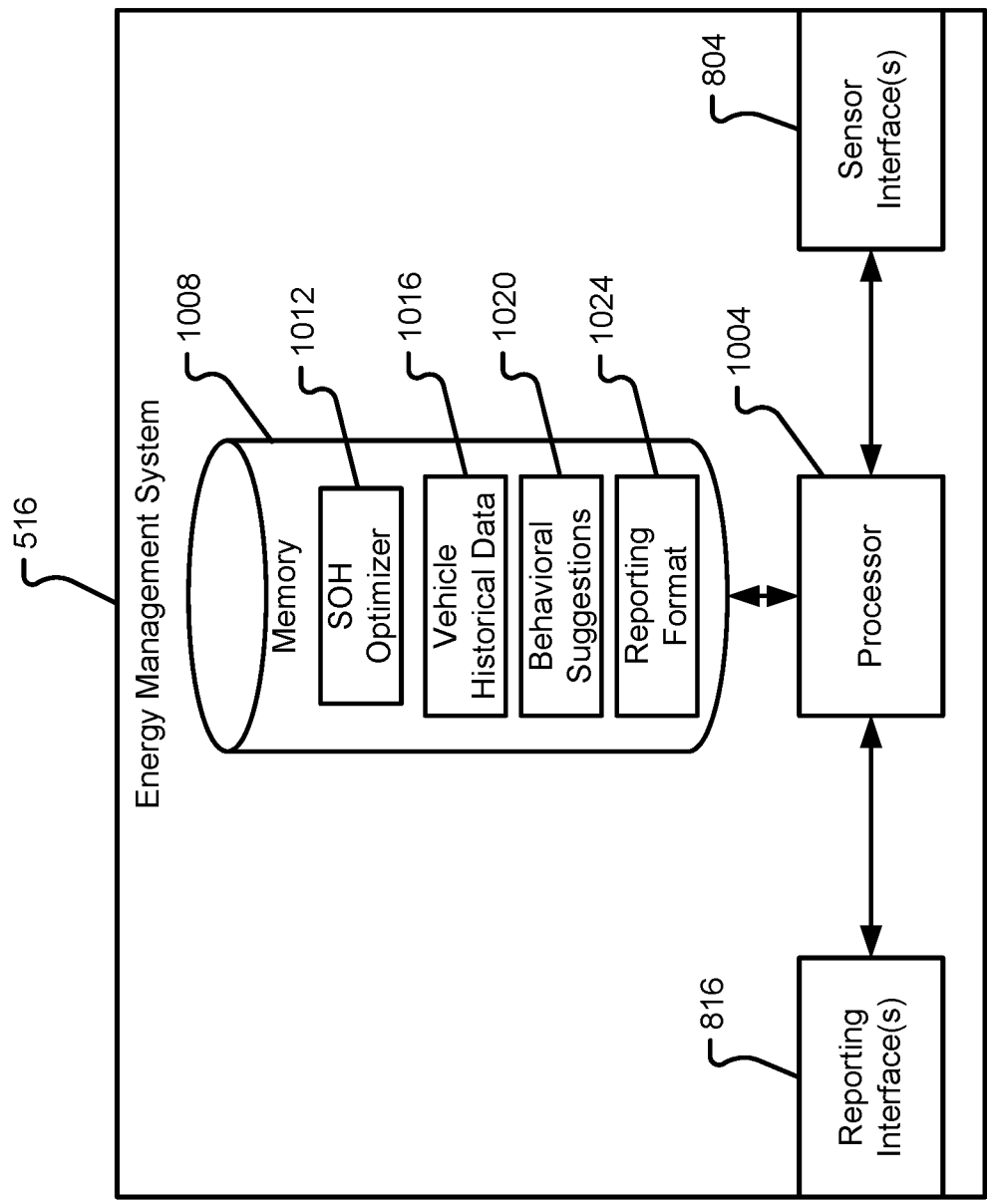
FIG. 10 is a block diagram of an energy management system implementing a State of Health optimizer in accordance with at least some embodiments of the present disclosure.

With reference now to FIG. 9, details of a remote server 904 that may be used to process SOH information received from a vehicle 100 (or more specifically a vehicle's energy management system 516) will be described in accordance with at least some embodiments of the present disclosure. The remote server 904 is shown to be in communication with a plurality of SOH information sources 908a-d. Although four SOH information sources 908a-d are depicted, it should be appreciated that a greater or lesser number of SOH information sources may provide SOH information to a particular remote server 904 without departing from the scope of the present disclosure.

The remote server 904 itself is shown to include a processor 912, a network interface 916, a power source 920, and memory 924. The memory 924 may be used to store data and instructions that are executable by the processor 912. As an example, the memory 924 may be used to store SOH optimizer instructions 928, SOH historical data 932, behavioral suggestions 936, and reporting format instructions 940.

The sources of SOH information may include, without limitation, individual vehicles (e.g., SOH information sources 908a and 908b), groups of vehicle fleets (e.g., SOH information sources 908c and 908d), and other collections of SOH information. In some embodiments, SOH information for a fleet or group of vehicles may be received from another remote server responsible for collecting and analyzing the SOH information for that fleet or group. Thus, the SOH information sources 908c and/or 908d may actually correspond to servers or other repositories of group information. In some embodiments, the information transmitted over signal path 832 may be received at the network interface 916 of the server 904.

The network interface 916 may be connected to the processor 912, power source 920, and memory 924 via a communication bus. The network interface 916 may be similar or identical to the communication systems 728 described in connection with FIG. 7. The processor 912 may be similar or identical to the CPU(S) 708 of FIG. 7. The power source 920 may correspond to an internal power source or a power converter for an external power source. As an example, the power source 920 may correspond to an internal battery or the like. Alternatively or additionally, the power source 920 may correspond to a power converter that converts external AC power into usable DC power for the components of the server 904.

The memory 924 may be similar or identical to one or more of the working memory 736, storage device 720, and/or computer readable media 724. In particular, the memory 924 may be used to store program code 744 in the form of the SOH optimizer instructions 928, behavioral suggestions 936, and/or reporting format instructions 940. In some embodiments, the SOH optimizer instructions 928 may include routines that analyze the various sources of SOH information and identify which batteries or vehicles (or battery/vehicle pairs) are performing better with respect to SOH than other batteries or vehicles (or battery/vehicle pairs). The SOH optimizer instructions 924 may identify charging conditions, driving conditions, temperature conditions, environmental conditions, or combinations thereof that contribute to better or worse SOH. Analysis results of the SOH optimizer instructions 928 may be used to generate behavioral suggestions 936, which can be distributed to vehicles or drivers of vehicles in appropriate reports.

The historical data 932 may include historical data for specific batteries, battery types, vehicles, battery/vehicle pairs, and the like. The historical data 932 may further include SOH parameters obtained from SOH information sources 908a-d over time. The historical data 932 can be stored in a table, a graph, a database, or any other format that is desired. As additional SOH information is received, the SOH historical data 932 may be updated (e.g., continuously or periodically) to incorporate the newly-received SOH information. In some embodiments, the SOH information stored in the historical data 932 may be organized according to vehicle type, fleet (e.g., groups of related drivers or vehicles owned/operated by a common enterprise), driving conditions, etc. Accordingly, it may be possible for the SOH optimizer instructions 928 to reference the SOH historical data 932 and identify certain driving behaviors, charging behaviors, or the like that are more likely to improve long-term SOH for batteries. This information can be incorporated into behavioral suggestions 936 to help possibly improve battery utilization and performance at either the vehicle level, the fleet level, or the like. As behavioral suggestions 936 are generated, the suggestions or optimal behavior conditions can be formatted into one or more reports with reporting format instructions 940. The reports can then be distributed to vehicles, drivers, fleet managers, etc.

FIG. 10 shows an example of an energy management system 516 incorporating features of the server(s) 904 discussed in connection with FIG. 9. In accordance with at least some embodiments of the present disclosure, a vehicle's energy management system 516 can be provided with functionality similar to that provided in a remote server 904. Even more specifically, an energy management system 516 is contemplated to have the ability to monitor its vehicle's behaviors, charging patterns, etc. and then suggest to a user of the vehicle a more appropriate or different driving behavior, charging pattern or schedule, etc. that can minimize degradation of battery SOH. As a non-limiting example, the energy management system 516 may be provided with SOH optimizer instructions 1012 that enable the energy management system 516 to determine improvements in battery use habits and make suggestions for the same to the vehicle's user.

The processor 1004 of the energy management system 516 may be similar or identical to the processor 912 of FIG. 9 (or any other processor described herein). The memory 1008 may be similar or identical to memory 924 of FIG. 9 (or any other computer memory described herein). The instructions and data sets stored in the memory 1008 are shown to include SOH optimizer instructions 1012, vehicle historical data 1016, behavioral suggestions 1020, and reporting format instructions 1024. The SOH optimizer instructions 1012 may be similar or identical to the SOH optimizer instructions 928 except that the SOH optimizer instructions 1012 may be conditioned to determine optimal behaviors based only on the vehicle's historical data 1016 rather than SOH information from a plurality of vehicles or fleets of vehicles. The vehicle historical data 1016 may include SOH parameters for the vehicle that have been collected by the SOH manager 812 over time. The SOH optimizer instructions 1012 may also be enabled to analyze the vehicle historical data 1016 and provide updated suggestions for battery use, charging, driving behaviors, etc. The suggestions may be generated in combination with efforts of the behavioral suggestions 1020 and may be reported to the vehicle's driver based on the reporting format instructions 1024. As an example, the suggested behavior changes may be reported to the user via the reporting interface(s) 816. The reports or suggestions may be formatted depending upon the interface used to transmit the report and/or other user preferences.

As a non-limiting example, the SOH optimizer instructions 1012 may determine that the user of the vehicle is driving the vehicle in a way that accelerates degradation of the battery SOH. If such a determination is made, the SOH optimizer instructions 1012 may determine improvements in the driving behavior (e.g., decreased accelerations, minimized loads/weight carried, change driving paths to include fewer stops, etc.) and the determined improvements can be reported to the user via the combined efforts of the behavioral suggestions 1020 and reporting format instructions 1024. As another example, the SOH optimizer instructions 1012 may determine that the user of the vehicle is subjecting the batteries to more than an optimal number of fast charge cycles. If such a determination is made, the SOH optimizer instructions 1012 may identify alternative charging conditions (e.g., regular or slow charge cycles) that would help improve the SOH of the vehicle's batteries. These alternative charging conditions could be suggested to the driver of the vehicle via the behavioral suggestions 1020 and reporting format instructions 1024. As still another example, the SOH optimizer instructions 1012 may determine that the user of the vehicle is charging the batteries before most of all of the battery charge is used (e.g., the user is regularly charging the batteries when they still have more than 50% of their charge). Based on this information and information related to the driver's normal driving habits (e.g., usual routes, scheduled meetings, etc.), the SOH optimizer instructions 1012 may identify alternative charging behaviors (e.g., different charging schedules, different charging times, etc.) that the user can utilize to more effectively drain the batteries prior to recharging the batteries (which can help improve the SOH of the batteries). Further still, if the SOH optimizer instructions 1012 identify a significant change in the battery SOH (e.g., some change that is outside a normal change or rate of change) and correlate the significant change with a particular behavior or set of behaviors, then the SOH optimizer instructions 1012 can identify the correlated behavior(s) and suggest that the driver attempt to avoid such behaviors in the future to avoid similar significant changes.

Figure 11:
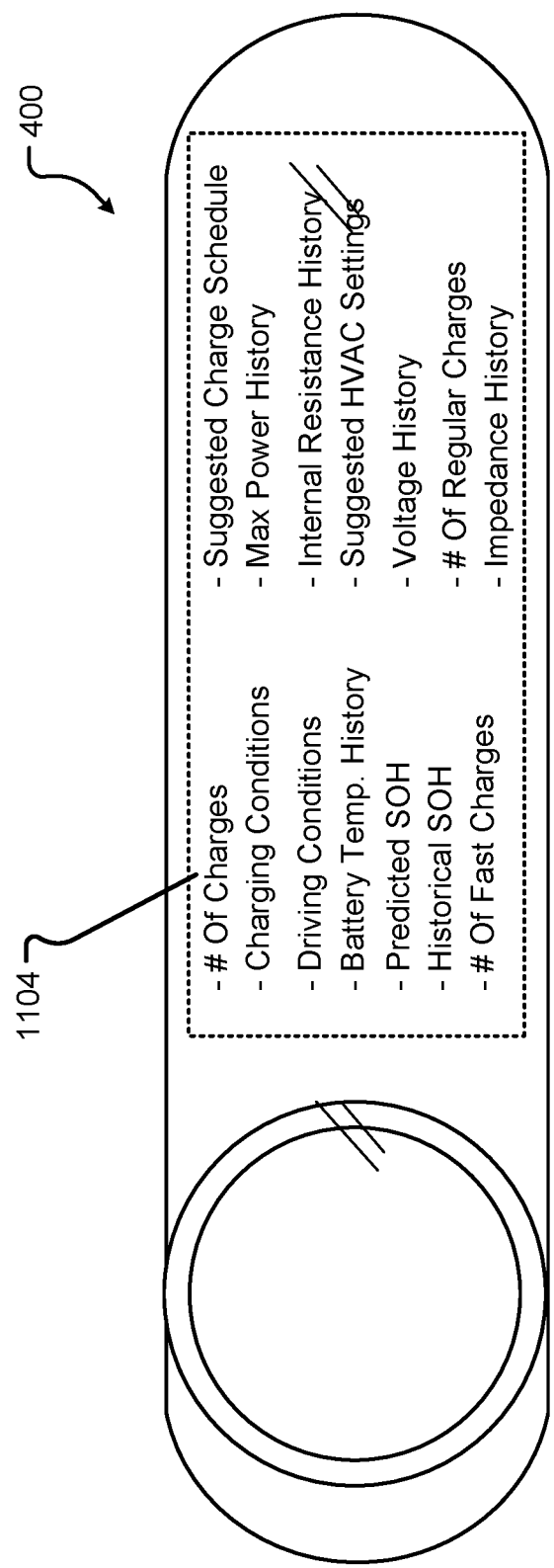
FIG. 11 depicts an instrument panel of the vehicle that presents various possible types of information related to vehicle or battery State of Health in accordance with at least some embodiments of the present disclosure.

With reference now to FIG. 11, additional details of the types of information that can be displayed to a user via the instrument panel 400 will be described in accordance with at least some embodiments of the present disclosure. The instrument panel 400 is shown to depict multiple types of SOH information or parameters that contribute to an SOH determination. It should be appreciated that some or all of this information may be presented simultaneously, sequentially, or in other formats to a user of the vehicle 100. It should also be appreciated that the illustrative information may not be displayed at all—at least until such time that a driver requests a presentation of such information on their instrument panel 400. FIG. 11 also shows that certain types of suggestions to improve battery SOH can also be displayed on the instrument panel 400.

The illustrative types of information that may be displayed on the instrument panel 400 include, without limitation, a count of the number of charges (e.g., for a lifetime of a battery or since some predetermined event), charging conditions (e.g., environmental conditions around the time of a battery charge), driving conditions (e.g., acceleration information, deceleration information, route information, etc.), battery temperature history (in table or graphical form), predicted SOH, historical SOH, a count of the number of fast charges (e.g., in total or as a ratio of the total number of charges), suggested charge schedule, max power history, internal resistance history, suggested HVAC settings, voltage history, a count of the number of regular charges (e.g., in total or as a ratio of the total number of charges), impedance history, and the like. The information may be presented in an SOH display 1104 of the instrument panel 400. The SOH display 1104 may correspond to one of many display options available via the panel 400. The information presented in the SOH display 1104 may be presented as raw data, in a graphical format, or as an SOH calculation that accounts for some or all of the presented data. Furthermore, any suggestions to improve SOH performance may be presented to the user in a different portion of the instrument panel 400 or in such a way that the suggestion is more prominent to the driver (e.g., as bolded font, at a higher location of the display, etc.). The user may be allowed to navigate or toggle through the various types of information presented in the SOH display 1104.

Figure 12:
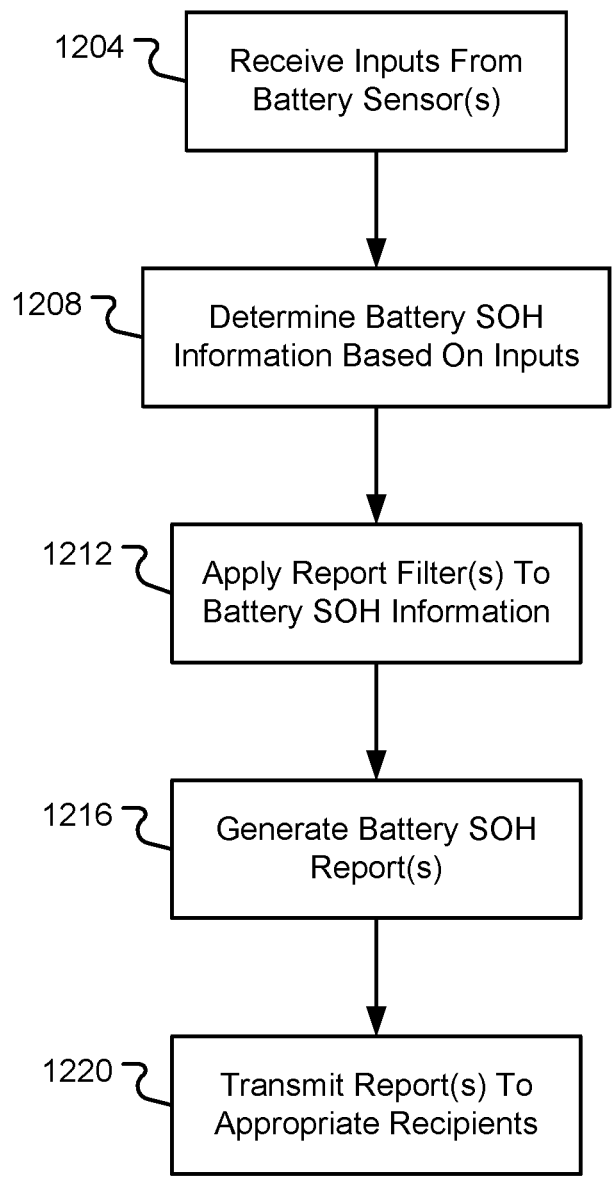
FIG. 12 is a flow diagram depicting a method of reporting State of Health information in accordance with at least some embodiments of the present disclosure.

With reference now to FIG. 12, a method of generating and transmitting battery SOH report(s) will be described in accordance with at least some embodiments of the present disclosure. The method begins when one or multiple sensor inputs are received at the sensor interface(s) 804 of the energy management system 516 (step 1204). The sensor input(s) may then be provided to the SOH manager 812 which determines SOH information based on those inputs (step 1208). In some embodiments, the SOH information determined by the SOH manager 812 may simply correspond to SOH parameters. In some embodiments, the SOH information may correspond to a calculated SOH metric or value that singularly represents the SOH of the measured battery. As an example, the calculated SOH metric may correspond to a simple ratio of current SOH relative to a new battery (e.g., SOH=90% of original SOH). The SOH information, in some embodiments, may be determined at a remote server 904 and returned back to the vehicle or the SOH information may be determined with a processor of the vehicle itself.

The method continues with the SOH manager 812 applying report filter(s) to the determined SOH information (step 1212). As can be appreciated, the filter(s) 814 may be applied prior to determining battery SOH information. For instance, the SOH manager 812 may filter the type of SOH parameters that are ultimately sent to a remote server 904 and then the remote server 904 may determine SOH information based on the received parameters.

The SOH manager 812 may then generate one or more SOH reports (step 1216), which can be transmitted to one or more determined recipients via the reporting interface(s) 816 (step 1220). In some embodiments, the reports may be generated at a remote server alone or with the combined effort of instructions stored in the energy management system 516. In some embodiments, the report(s) may simply correspond to a formatted display of the determined SOH information. The SOH information may be formatted according to the display method used in the report. For instance, if the report is being presented via instrument panel 400, then the report may simply correspond to a display (e.g., LED or LCD presentation) of the SOH information. In other embodiments, the report may be formatted in an electronic document or spreadsheet that is capable of being distributed across a distributed communication network. In some embodiments, the report containing SOH information can be used as a way to retain resale value of the vehicle, or as a way to judge the usage of battery during a vehicle leasing. Thus, as the vehicle 100 is used, the SOH information may provide a metric for the wear and tear that the vehicle (and specifically the battery) undergoes.

Figure 13:
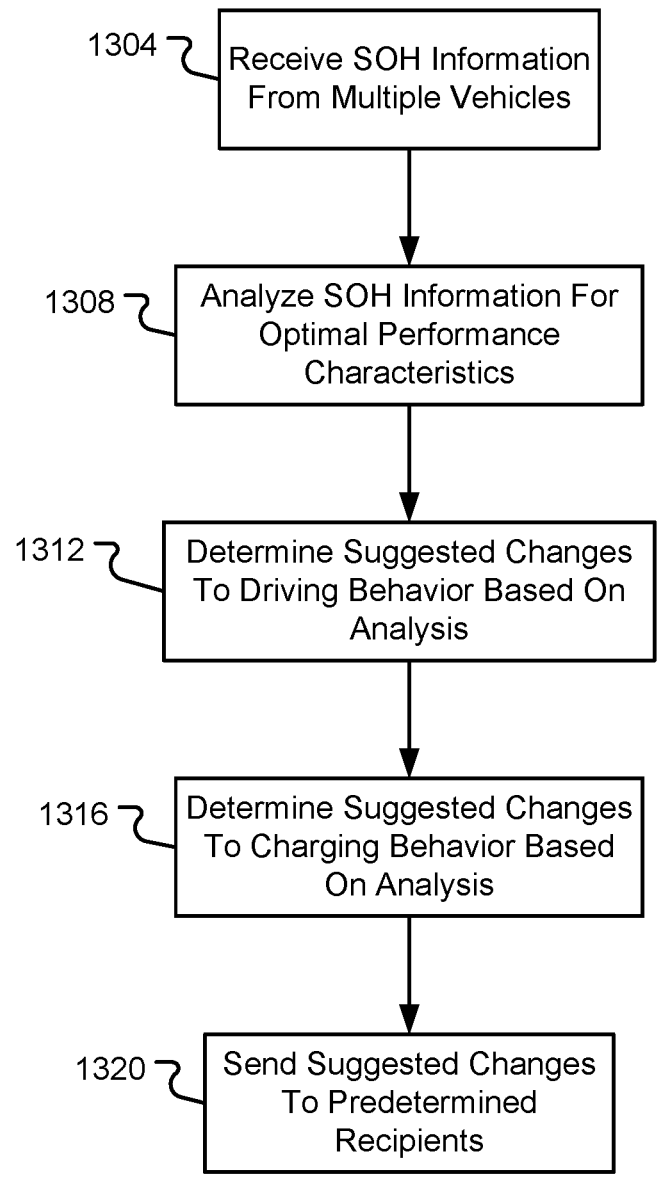
FIG. 13 is a flow diagram depicting a method of suggesting changes in vehicle utilization to improve battery State of Health in accordance with at least some embodiments of the present disclosure.

With reference now to FIG. 13, a method of preparing suggested changes to vehicle or battery utilization to improve battery SOH will be described in accordance with at least some embodiments of the present disclosure. The method begins when SOH information is received from multiple vehicles (step 1304). The SOH information may be received from multiple individual vehicles or from a fleet of vehicles at a network interface 916 of a server 904. The recipient of the SOH information (e.g., server 904) may then utilize its SOH optimizer instructions 928 to identify which vehicles among the plurality of vehicles has a better SOH performance over time (e.g., has a slower degradation in SOH). For instance, those vehicles in the top 10% from among the plurality of vehicles with respect to SOH performance may be identified and any commonalities between those vehicles (e.g., vehicle type, battery type, charging behavior, driving behavior, etc.) may further be identified.

Based on the identified commonalities between the best performing sources of SOH information, the SOH optimizer instructions 928 may determine suggested changes to driving behavior (step 1312) and/or charging behavior (step 1316). As an example, if the SOH optimizer instructions 928 determines that the best performing vehicles or fleet of vehicles has a relatively low number of fast charges or a low overall ratio of fast charges to total charges, then the SOH optimizer instructions 928 may identify the commonality among top performing vehicles as avoidance of fast charging cycles. This commonality may be provided as a suggested change in behavior to other vehicles or fleets (step 1320). As another example, the commonality between top performing vehicles may correspond to a similar driving behavior and that similarity may be provided as a suggested change in driving behavior to vehicles that have not been among those top performing vehicles. As another example, the SOH optimizer instructions 928 may identify commonalities among the worst performing vehicles with respect to SOH degradation and those commonalities may be identified as suggested behaviors to avoid. Said another way, suggested changes in driving or charging behaviors may correspond to suggestions to perform certain actions or avoid certain actions (or combinations thereof).

Figure 14:
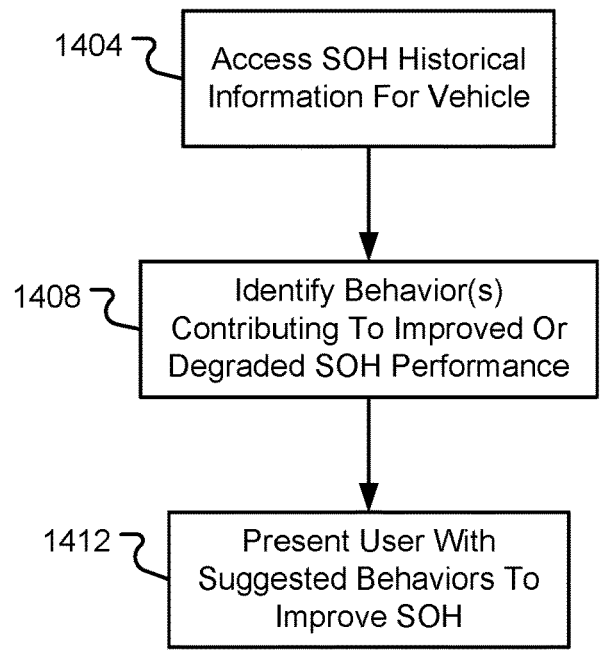
FIG. 14 is a flow diagram depicting another method of suggesting changes in vehicle utilization to improve battery State of Health in accordance with at least some embodiments of the present disclosure.

With reference now to FIG. 14, a method of identifying suggested changes in vehicle or battery utilization for a single vehicle 100 will be described in accordance with at least some embodiments of the present disclosure. The method begins with an SOH optimizer instructions 1012 accessing historical vehicle data 1016 (step 1404). The accessed vehicle data 1016 may be stored local to the vehicle 100 (e.g., in memory resident on the vehicle 100) or it may be stored remote from the vehicle 100 (e.g., in memory not resident on the vehicle 100).

As the historical vehicle data 1016 is analyzed, the SOH optimizer instructions 1012 may attempt to identify one or more behaviors that have contributed to improved or degraded SOH performance (step 1408). In particular, the SOH optimizer instructions 1012 may scan the historical vehicle data 1016 for instances in time where the SOH performance had a quantum negative change in SOH performance or an extended period of time where the SOH performance did not degrade in a substantial way.

Based on the identified behaviors, the SOH optimizer instructions 1012 may present the user with suggested behaviors (to perform or avoid) that may contribute to improved SOH performance (step 1412). The presentation may be provided directly to the user on the instrument panel 400 or the presentation may be provided to a communication device of the user via a remote server 904. The method of FIG. 14 may be performed continuously, periodically, or in requests for suggestions by the user (e.g., on an as-needed basis).

Figure 15:
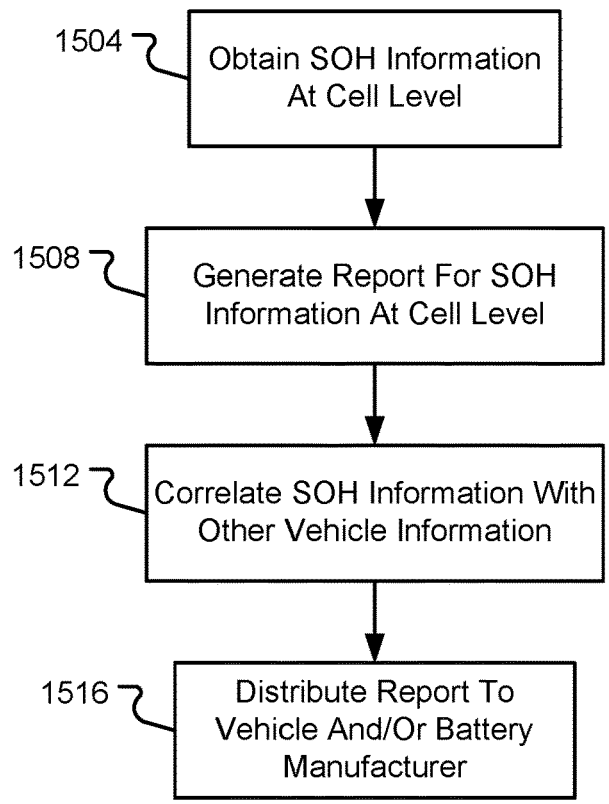
FIG. 15 is a flow diagram depicting a method of determining and reporting on battery cell State of Health information in accordance with at least some embodiments of the present disclosure.

With reference now to FIG. 15, a method of generating and distributing SOH information at a cell level will be described in accordance with at least some embodiments of the present disclosure. The method begins when SOH information is received from one or a plurality of SOH information sources at a remote server 904 (step 1504). In some embodiments, the SOH information may be granular (e.g., at the cell level), which means that SOH information for a particular vehicle may comprise SOH information for multiple cells within the vehicle.

The received SOH information may then be organized into one or more reports (step 1508). The one or more reports may be a current reporting of the SOH information or the reports may also include historical information for each of the reporting batteries/cells. In other words, the report may simply correspond to a snapshot of information at a particular time or the report may also include historical information so that trends in SOH performance are more readily available from the report.

The method continues by correlating the SOH information with other vehicle information (step 1512). As an example, cells of similar types (even if reporting from different vehicles) may be correlated together along with their corresponding SOH information and driving/charging information. Alternatively or additionally, cells from vehicles of similar types (even if the cells are different) may be correlated together. Alternatively or additionally, cells from the same manufacturer may be correlated together. Alternatively or additionally, cells having similar chemistry may be correlated together. The method may then continue with the generation and distribution of a report to a vehicle and/or battery manufacturer that reports the SOH information for the group of cells (step 1516). Such a report may be used to help identify charging behaviors, driving behaviors, or optimal battery/vehicle combinations that should be used to achieve improve SOH performance over time.

Figure 16:
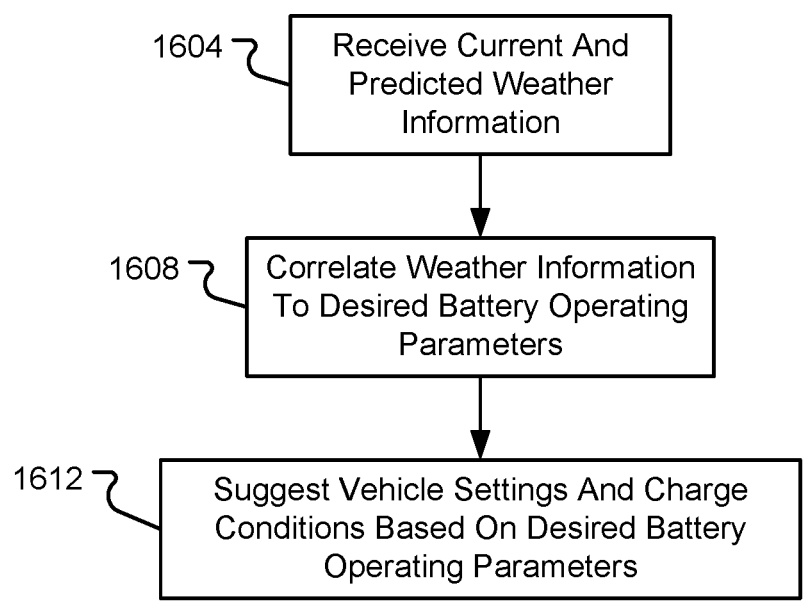
FIG. 16 is a flow diagram depicting a method of suggesting changes in vehicle utilization based on weather inputs in accordance with at least some embodiments of the present disclosure.

With reference now to FIG. 16, a method of suggesting vehicle settings and/or charge conditions based on external weather events (current or predicted) will be described in accordance with at least some embodiments of the present disclosure. The method begins when current and/or predicted weather information is received for an area surrounding a vehicle 100 (step 1604). The received weather information may include temperature information, atmospheric pressure information, humidity information, and the like. The weather information may be received from sensors that are local to the vehicle and/or from remote services that have access to such information (e.g., from remote servers).

The received weather information may then be correlated to a desired battery operating parameter (step 1608). As a non-limiting example, it may be determined that at lower environmental temperatures, it could be desirable from an SOH performance perspective to drive the vehicle 100 at slower speeds whereas at higher environmental temperatures, it is acceptable to drive the vehicle 100 at higher speeds. Other types of settings that may be suggested or controlled for the vehicle may include optimal HVAC settings to accommodate optimal SOH performance at the current or predicted weather condition. For instance, there may be instances where the SOH optimizer instructions 928, 1012 determine that heating the vehicle for an amount of time prior to driving is desirable from an SOH performance perspective when the surrounding temperature is below a particular threshold.

These and other suggestions related to vehicle settings or battery charge conditions (e.g., whether to charge the batteries inside or outside) may then be provided to a driver of the vehicle 100 (step 1612). As a non-limiting example, the SOH optimizer instructions 928, 1012 may suggest that the user charge their vehicle in a controlled weather environment (e.g., in a garage) if the external temperatures are below a particular threshold as such a behavior may improve the overall SOH performance of the vehicle's batteries.

The exemplary systems and methods of this disclosure have been described in relation to vehicle systems and electric vehicles. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

Furthermore, while the exemplary embodiments illustrated herein show the various components of the system collocated, certain components of the system can be located remotely, at distant portions of a distributed network, such as a LAN and/or the Internet, or within a dedicated system. Thus, it should be appreciated, that the components of the system can be combined into one or more devices, such as a server, communication device, or collocated on a particular node of a distributed network, such as an analog and/or digital telecommunications network, a packet-switched network, or a circuit-switched network. It will be appreciated from the preceding description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire, and fiber optics, and may take the form of acoustic or light waves, such as those generated during radio-wave and infra-red data communications.

While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as a program embedded on a personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, sub-combinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments include a vehicle. One non-limiting example of the vehicle includes a plurality of battery sensors, each of the plurality of sensors being configured to translate one or multiple battery performance parameters into an electrical signal indicative of the one or multiple battery performance parameters and a energy management system that includes: one or more sensor interfaces that enable the energy management system to receive electrical signals from the plurality of battery sensors; a State of Charge (SOC) manager that prepares SOC information describing a SOC of one or more batteries in the vehicle based on the received electrical signals and reports the SOC information via an instrument panel of the vehicle; and a State of Health (SOH) manager that prepares SOH information describing a SOH of the one or more batteries in the vehicle based on the received electrical signals and reports the SOH information via the instrument panel of the vehicle.

Aspects of the above vehicle provide that the energy management system applies one or more report filters to the SOH information such that a first set of SOH information is reported via the instrument panel and a second set of the SOH information is reported to local data storage and/or a remote server. In some embodiments, the first set of SOH information comprises a subset of SOH information contained in the second set of SOH information. In some embodiments, the second set of SOH information includes battery performance parameters that are not included in the first set of SOH information.

Aspects of the above vehicle also include that the SOH information comprises a plurality or representation of the following performance parameters: battery capacity, battery internal resistance, battery self-discharge, battery charge acceptance, battery discharge capabilities, mobility of electrolytes, and cycle-counting information.

Aspects of the above vehicle also contemplate that the energy management system further comprises SOC optimizer instructions that, when executed by a processor, determine a suggested change in driving behavior and/or battery charge behavior based on a historical trend identified in the SOH of the one or more batteries. In some embodiments, the suggested change in driving behavior and/or battery charge behavior comprises one or more behaviors to avoid. In some embodiments, the suggested change in driving behavior and/or battery charge behavior comprises one or more behaviors to implement. In some embodiments, the suggested change in driving behavior and/or battery charge behavior is presented via one or both of the instrument panel of the vehicle or a communication device of a user of the vehicle. In some embodiments, the suggested change in driving behavior and/or battery charge behavior is dependent, at least in part, upon an environmental condition around the vehicle.

Any one or more of the aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

The term "electric vehicle" (EV), also referred to herein as an electric drive vehicle, may use one or more electric motors or traction motors for propulsion. An electric vehicle may be powered through a collector system by electricity from off-vehicle sources, or may be self-contained with a battery or generator to convert fuel to electricity. An electric vehicle generally includes a rechargeable electricity storage system (RESS) (also called Full Electric Vehicles (FEV)). Power storage methods may include: chemical energy stored on the vehicle in on-board batteries (e.g., battery electric vehicle or BEV), on board kinetic energy storage (e.g., flywheels), and/or static energy (e.g., by on-board double-layer capacitors). Batteries, electric double-layer capacitors, and flywheel energy storage may be forms of rechargeable on-board electrical storage.

The term "hybrid electric vehicle" refers to a vehicle that may combine a conventional (usually fossil fuel-powered) powertrain with some form of electric propulsion. Most hybrid electric vehicles combine a conventional internal combustion engine (ICE) propulsion system with an electric propulsion system (hybrid vehicle drivetrain). In parallel hybrids, the ICE and the electric motor are both connected to the mechanical transmission and can simultaneously transmit power to drive the wheels, usually through a conventional transmission. In series hybrids, only the electric motor drives the drivetrain, and a smaller ICE works as a generator to power the electric motor or to recharge the batteries. Power-split hybrids combine series and parallel characteristics. A full hybrid, sometimes also called a strong hybrid, is a vehicle that can run on just the engine, just the batteries, or a combination of both. A mid hybrid is a vehicle that cannot be driven solely on its electric motor, because the electric motor does not have enough power to propel the vehicle on its own.

The term "rechargeable electric vehicle" or "REV" refers to a vehicle with on board rechargeable energy storage, including electric vehicles and hybrid electric vehicles.

What is claimed is:

1. A vehicle, comprising:
   a plurality of battery sensors, each of the plurality of sensors being configured to translate one or multiple battery performance parameters into an electrical signal indicative of the one or multiple battery performance parameters; and
   a energy management system comprising:
      one or more sensor interfaces that enable the energy management system to receive electrical signals from the plurality of battery sensors;
      a State of Charge (SOC) manager that prepares SOC information describing a SOC of one or more batteries in the vehicle based on the received electrical signals and reports the SOC information via an instrument panel of the vehicle;
      a State of Health (SOH) manager that prepares first SOH information describing a SOH of the one or more batteries in the vehicle based on the received electrical signals and reports the first SOH information via the instrument panel of the vehicle; and
      SOH optimizer instructions that, when executed by a processor, cause the processor to:
         identify a plurality of vehicles;
         determine a subset of vehicles in the identified plurality vehicles having better SOH performance than remaining vehicles in the identified plurality of vehicles;
         analyze second SOH information describing a SOH of batteries in the subset of vehicles;
         identify commonalities within the analyzed second SOH information that contribute to the subset of vehicles having the better SOH performance; and determine a suggested change in a particular use of the one or more batteries by the user of the vehicle based on the identified commonalities.

2. The vehicle of claim 1, wherein the energy management system applies one or more report filters to the first SOH information such that a first set of the first SOH information is reported via the instrument panel and a second set of the first SOH information is reported to a data storage medium, and wherein the subset of vehicles is about 10% of the plurality of vehicles.

3. The vehicle of claim 2, wherein the first set of the first SOH information comprises a subset of SOH information contained in the second set of the first SOH information.

4. The vehicle of claim 2, wherein the second set of the first SOH information includes battery performance parameters that are not included in the first set of the first SOH information.

5. The vehicle of claim 1, wherein the first and the second SOH information comprise a plurality or representation of the following performance parameters: battery capacity, battery internal resistance, battery self-discharge, battery charge acceptance, battery discharge capabilities, mobility of electrolytes, and cycle-counting information.

6. The vehicle of claim 1, wherein the suggested change in the particular use of the one or more batteries by the user of the vehicle corresponds to a suggested change to one or more of a driving behavior of the user while driving the vehicle and a battery charge behavior of the user when charging the one or more batteries of the vehicle, and wherein the instructions cause the processor to organize the second SOH information according to one or more characteristics of battery cells within the batteries of the subset of vehicles.

7. The vehicle of claim 6, wherein the suggested change comprises one or more behaviors to avoid, and wherein the one or more characteristics includes battery cells from a same manufacturer, battery cells having similar chemistry, and battery cells from similar types of vehicles.

8. The vehicle of claim 6, wherein the suggested change comprises one or more behaviors to implement.

9. The vehicle of claim 6, wherein the suggested change is presented via one or both of the instrument panel of the vehicle or a communication device of the user of the vehicle.

10. The vehicle of claim 6, wherein the suggested change is dependent, at least in part, upon an environmental condition around the vehicle.

11. An energy management system for use in an electric vehicle, the energy management system comprising:
one or more sensor interfaces that enable the energy management system to receive electrical signals from a plurality of battery sensors;
a State of Charge (SOC) manager that prepares SOC information describing a SOC of one or more batteries in the vehicle based on the received electrical signals and reports the SOC information via an instrument panel of the vehicle;
a State of Health (SOH) manager that prepares first SOH information describing a SOH of the one or more batteries in the vehicle based on the received electrical signals and reports the first SOH information via the instrument panel of the vehicle; and
SOH optimizer instructions that, when executed by a processor, cause the processor to:
identify a plurality of vehicles;
determine a subset of vehicles in the plurality vehicles to have better SOH performance than remaining vehicles in the plurality of vehicles;
analyze second SOH information describing a SOH of batteries in the subset of vehicles;
identify commonalities within the analyzed second SOH information that contribute to the subset of vehicles having the better SOH performance; and
determine a suggested change in a particular use of the one or more batteries by the user of the vehicle based on the identified commonalities.

12. The energy management system of claim 11, wherein the first SOH information and the SOC information are configured to be displayed simultaneously via the instrument panel.

13. The energy management system of claim 11, wherein the first SOH information and the SOC information are configured to be displayed separately and at different times via the instrument panel.

14. The energy management system of claim 11, wherein the first and second SOH information comprise a plurality of a charge count, historical charging conditions, historical driving conditions, battery temperature history, predicted SOH, historical SOH, a count of fast charges, a suggested charge schedule, a max power history, an internal resistance history, suggested HVAC settings, voltage history, and a ratio of fast charges to total charges.

15. The energy management system of claim 14, further comprising one or more report filters that are applied to the first SOH information such that a first set of the first SOH information is reported via the instrument panel and a second set of the first SOH information is reported to a remote server.

16. A method, comprising:
receiving electrical signals from a plurality of battery sensors;
preparing State of Charge (SOC) information describing a SOC of one or more batteries in a vehicle based on the received electrical signals;
reporting the SOC information via an instrument panel of the vehicle;
preparing first State of Health (SOH) information describing a SOH of the one or more batteries in the vehicle based on the received electrical signals;
reporting the first SOH information via the instrument panel of the vehicle;
identifying a plurality of vehicles;
determining a subset of vehicles in the identified plurality vehicles having better SOH performance than remaining vehicles in the identified plurality of vehicles;
analyzing second SOH information describing a SOH of batteries in the subset of vehicles;
identifying commonalities within the analyzed second SOH information that contribute to the subset of vehicles having the better SOH performance; and
determining a suggested change in a particular use of the one or more batteries by the user of the vehicle based on the identified commonalities.

17. The method of claim 16, further comprising:
applying one or more report filters to the first SOH information;
based on the application of the one or more report filters, obtaining a first set of the first SOH information and a second set of the first SOH information;
providing the first set of the first SOH information to the instrument panel via a first reporting interface; and
providing the second set of the first SOH information to a remote server via a second reporting interface.

18. The method of claim 17, wherein the suggested change in the particular use of the one or more batteries by the user of the vehicle corresponds to a suggested change to one or more of a driving behavior of the user while driving the vehicle and a battery charge behavior of the user when charging the one or more batteries of the vehicle.

19. The method of claim 18, wherein the suggested change is dependent, at least in part, upon an environmental condition around the vehicle.

20. The method of claim 19, wherein the suggested change is presented via one or both of the instrument panel of the vehicle or a communication device of the user of the vehicle.

\* \* \* \* \*

UNITED STATES PATENT AND TRADEMARK OFFICE
CERTIFICATE OF CORRECTION

PATENT NO.         : 10,598,734 B2
APPLICATION NO.    : 15/396057
DATED              : March 24, 2020
INVENTOR(S)        : Austin L. Newman et al.

Page 1 of 1

It is certified that error appears in the above-identified patent and that said Letters Patent is hereby corrected as shown below:

In the Claims

Claim 11, Column 27, Lines 65-66, delete "the plurality vehicles to have" and insert --the identified plurality vehicles having-- therein.
Claim 11, Column 27, Line 67, after "the" insert --identified-- therein.

Signed and Sealed this
Twenty-sixth Day of May, 2020

Andrei Iancu
*Director of the United States Patent and Trademark Office*